US011485052B2

United States Patent
Nagoya et al.

(10) Patent No.: US 11,485,052 B2
(45) Date of Patent: Nov. 1, 2022

(54) RESIN PRODUCT, METHOD OF MAKING RESIN PRODUCT, INTERCHANGEABLE LENS, AND OPTICAL DEVICE

(71) Applicant: CANON KABUSHIKI KAISHA, Tokyo (JP)

(72) Inventors: Toshimitsu Nagoya, Kawasaki (JP); Makoto Kojima, Atsugi (JP); Kei Oikawa, Kawasaki (JP); Yukiya Enokida, Kawasaki (JP); Takashi Endo, Kawasaki (JP); Osamu Morisaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 745 days.

(21) Appl. No.: 16/503,820

(22) Filed: Jul. 5, 2019

(65) Prior Publication Data
US 2020/0031023 A1    Jan. 30, 2020

(30) Foreign Application Priority Data

Jul. 30, 2018 (JP) .............................. JP2018-142974
Jun. 21, 2019 (JP) .............................. JP2019-115710

(51) Int. Cl.
*G02B 1/118*    (2015.01)
*G02B 7/14*    (2021.01)
(Continued)

(52) U.S. Cl.
CPC .......... *B29C 33/3842* (2013.01); *B29C 43/02* (2013.01); *B29C 43/36* (2013.01);
(Continued)

(58) Field of Classification Search
CPC ........... G02B 1/118; G02B 1/11; G02B 1/111; G02B 1/04; G02B 1/12; G02B 7/14;
(Continued)

(56) References Cited

U.S. PATENT DOCUMENTS 5,353,070 A * 10/1994 Mitani ..................... G02B 1/11
                                                          348/786
7,545,583 B2    6/2009 Hayashi et al.
(Continued)

FOREIGN PATENT DOCUMENTS

CN    1837863 A    9/2006
CN    101233429 A    7/2008
(Continued)

OTHER PUBLICATIONS

Second Office Action in Chinese Application No. 201910673942.9 (dated Jan. 2022).
(Continued)

*Primary Examiner* — Stephone B Allen
*Assistant Examiner* — Adam W Booher
(74) *Attorney, Agent, or Firm* — Venable LLP

(57) ABSTRACT

A resin product including an antireflection surface includes a plurality of first concave portions, a plurality of second concave portions, and a component surface. The first concave portions have opening widths equal to or larger than 1 μm and equal to or smaller than 300 μm. The second concave portions are formed on each of the plurality of first concave portions and have opening widths equal to or larger than 10 nm and equal to or smaller than 1 μm. The component surface is configured to surround each of the plurality of first concave portions.

20 Claims, 30 Drawing Sheets

(51) Int. Cl.
*B29C 33/38* (2006.01)
*B29C 43/02* (2006.01)
*B29C 43/36* (2006.01)
*B29C 45/26* (2006.01)
*B29K 105/16* (2006.01)

(52) U.S. Cl.
CPC ............. *B29C 45/26* (2013.01); *G02B 1/118* (2013.01); *B29K 2105/16* (2013.01); *G02B 7/14* (2013.01)

(58) Field of Classification Search
CPC ..... B29C 33/3842; B29C 43/02; B29C 43/36; B29C 45/26; B29C 45/372; B29C 43/021; B29C 2043/025; B29K 2105/16; B81C 1/00444; B81C 1/0046
See application file for complete search history.

(56) References Cited

U.S. PATENT DOCUMENTS

| | | |
|---|---|---|
| 8,529,075 B2 | 9/2013 | Yamada et al. |
| 8,632,836 B2 | 1/2014 | Fredriksson et al. |
| 8,703,346 B2 | 4/2014 | Satake et al. |
| 9,416,461 B2 | 8/2016 | Minari et al. |
| 9,642,708 B2 | 5/2017 | Fredriksson et al. |
| 11,040,471 B2 | 6/2021 | Sano et al. |
| 2005/0084622 A1* | 4/2005 | Houghtaling .......... G02B 1/113 428/323 |
| 2006/0093809 A1* | 5/2006 | Hebrink ................ B29C 55/023 428/323 |
| 2009/0026658 A1 | 1/2009 | Hosoda et al. |
| 2009/0257127 A1 | 10/2009 | Okayama et al. |
| 2013/0236697 A1 | 9/2013 | Walker, Jr. et al. |
| 2015/0037922 A1 | 2/2015 | Sachs |
| 2015/0322293 A1* | 11/2015 | Rathore ................ C09D 183/04 524/770 |
| 2016/0225924 A1 | 8/2016 | Kuan et al. |
| 2017/0307783 A1* | 10/2017 | Hongo ..................... G02B 1/14 |
| 2019/0084200 A1 | 3/2019 | Oikawa |
| 2019/0389110 A1* | 12/2019 | Sano .................... B29C 45/372 |

FOREIGN PATENT DOCUMENTS

| | | |
|---|---|---|
| CN | 101686862 A | 3/2010 |
| CN | 101796434 A | 8/2010 |
| CN | 102349184 A | 2/2012 |
| CN | 102575373 A | 7/2012 |
| CN | 102795007 A | 11/2012 |
| CN | 103221846 A | 7/2013 |
| CN | 103959485 A | 7/2014 |
| CN | 105742440 A | 7/2016 |
| CN | 106662674 A | 5/2017 |
| EP | 3 182 178 A1 | 6/2017 |
| JP | 2009-128538 A | 6/2009 |
| JP | 2015-184428 A | 10/2015 |
| WO | 2008/126523 A1 | 10/2008 |

OTHER PUBLICATIONS

First Office Action in Chinese Application No. 201910673942.9 (dated Jun. 2021).

Rejection Decision in Chinese Application No. 201910673942.9 (dated Jun. 2022).

* cited by examiner

FIG.17

|  | RATIO OF AREA OF FIRST CONCAVE PORTIONS | SHORTEST DISTANCE OF FIRST CONCAVE PORTIONS | ANTIREFLECTION PERFORMANCE | DURABILITY |
|---|---|---|---|---|
| SAMPLE 1 | 34% | 10μm | B | B |
| SAMPLE 2 | 64% | 8μm | B | B |
| SAMPLE 3 | 10% | 100μm | B | A |
| SAMPLE 4 | 95% | 5μm | A | B |
| SAMPLE 5 | 96% | 2μm | B | C |
| SAMPLE 6 | 9% | 110μm | C | B |

FIG.30

| | MASS PERCENTAGE OF FILLER | ROUGHNESS Spc OF FREE SURFACE | ANTIREFLECTION PERFORMANCE | DURABILITY |
|---|---|---|---|---|
| SAMPLE 7 | 5% | 1500 | B | B |
| SAMPLE 8 | 15% | 3000 | B | A |
| SAMPLE 9 | 30% | 6500 | A | A |
| SAMPLE 10 | 45% | 9000 | A | B |
| SAMPLE 11 | 4% | 1450 | C | A |
| SAMPLE 12 | 46% | 9100 | A | C |

RESIN PRODUCT, METHOD OF MAKING RESIN PRODUCT, INTERCHANGEABLE LENS, AND OPTICAL DEVICE

BACKGROUND OF THE INVENTION

Field of the Invention

The present invention relates to a resin product including an antireflection surface, a method of making the resin product, an interchangeable lens, and an optical device.

Description of the Related Art

Various optical devices contain a light-shielding member to reduce stray light. The stray light is scattered light produced in the vicinity of an optical path of an optical device, and affects the performance of the optical device. Thus, the light-shielding member is disposed to absorb or reduce the stray light. For example, the stray light produced in an imaging device, such as a camera, may cause deterioration of image, including deteriorated contrast, ghost, and flare. In addition, in a measuring device such as a reflectometer, the stray light may cause a measurement error, impairing reliability on the measurement value. For this reason, it is desired that the stray light is reduced in the optical devices as much as possible. Preferably, the light-shielding member has antireflection performance to absorb the stray light from its surface and reduce the scattered light to almost zero.

Conventionally, there are known techniques to reduce the stray light by forming an antireflection surface on the light-shielding member. For example, in one technique, black material is used for an inner surface of a lens barrel of a projector or a camera, or the inner surface is coated with black paint. In addition, since the black material or the black coating may insufficiently reduce the scattered light produced from incident light with a large incidence angle, the surface of the light-shielding member may be roughened as necessary by using a method such as sandblasting, to reduce the scattered light.

In another technique, a low-refraction layer and a high-refraction layer are laminated on the light-shielding member to utilize light interference to reduce the surface reflection. Furthermore, an antireflection surface having a moth eye structure is recently attracting attention because the structure reduces the surface reflection more sufficiently than the use of the light interference. In the moth eye structure, the refractive index of the light-shielding member is gently distributed by forming a fine rough surface on the light-shielding member. On the fine rough surface, fine concave and convex portions are formed, each smaller than a wavelength of the visible light.

In the antireflection fine rough surface having the moth eye structure, the fine concave and convex portions are arranged with regularity at a pitch that is preferably equal to or smaller than a wavelength of incident light. For example, each of the fine convex portions of the fine rough surface stands vertically on a base, and the area of the cross section of each fine convex portion gradually decreases as each convex portion extends toward its leading end. Thus, since the refractive index of each convex portion gently changes on the interface of each convex portion, the reflection on the antireflection surface is reduced to achieve low reflectivity of the antireflection surface.

The moth eye structure is so effective for reducing the surface reflection that the structure is used in components of various optical devices, such as displays, imaging devices, illuminating devices, and projectors. Japanese Patent Application Publication No. 2015-184428 describes a technique that achieves higher antireflection performance and antireflection effect on oblique incident light. In this technique, fine projections are formed on a wave-shaped portion. The wave is large and gentle, and has a pitch of about 100 to 600 μm. The fine projections are formed at a pitch equal to or smaller than a wavelength of the visible light.

Japanese Patent Application Publication No. 2009-128538 describes a technique that forms a special surface shape by using a dry etching method. In this surface shape, a plurality of fine concave and convex portions is formed on a rough surface. The rough surface has a surface roughness larger than a predetermined wavelength, and the plurality of fine concave and convex portions has an average pitch equal to or smaller than a predetermined wavelength.

However, in the structure described in Japanese Patent Application Publication No. 2015-184428, when the antireflection surface is wiped for cleaning, the fine projections on the antireflection surface may be broken, reducing the antireflection effect. Thus, the antireflection surface has a problem on durability. In particular, in a design aiming for high antireflection performance, the concave or convex portions of the fine rough surface tend to have sharp edges, or to become finer. This design causes a corresponding product to be delicate and fragile, and dust to be easily produced in the fine rough surface. Thus, one problem is that the antireflection fine rough surface having the moth eye structure is difficult to use in the interior of optical devices, such as on a lens barrel or a body of a camera, in which the dust is not desired. Another problem is that, since the antireflection performance becomes insufficient if the durability is improved, achieving both the antireflection performance and the durability is difficult.

In a processing method described in Japanese Patent Application Publication No. 2009-128538, the complicated process causes the production time and cost to be unacceptable. In addition, not only the method of Japanese Patent Application Publication No. 2009-128538, but also other methods to form a special surface shape for achieving a high-performance light-shielding member tend to increase the production time and cost. In contrast, if the surface of the light-shielding member is formed by using the method, such as sandblasting, which involves short production time and low cost, the light-shielding performance may become insufficient.

For this reason, there has been desired a product including an antireflection surface that can be simply made at low cost, has good durability, produces less dust, and has good antireflection performance.

SUMMARY OF THE INVENTION

According to a first aspect of the present invention, a resin product including an antireflection surface includes a plurality of first concave portions having opening widths equal to or larger than 1 μm and equal to or smaller than 300 μm, a plurality of second concave portions formed on each of the plurality of first concave portions and having opening widths equal to or larger than 10 nm and equal to or smaller than 1 μm, and a component surface configured to surround each of the plurality of first concave portions.

According to a second aspect of the present invention, a method of making a resin product including an antireflection surface includes preparing a mold, a molding surface of which including a plurality of first convex portions and a plurality of second convex portions formed on surfaces of the plurality of first convex portions, the plurality of first convex portions having diameters equal to or larger than 1 µm, the plurality of second convex portions having diameters equal to or larger than 10 nm and equal to or smaller than 1 µm, and forming a plurality of first concave portions on a resin material and forming a plurality of second concave portions on inner surfaces of the plurality of first concave portions by causing the resin material to contact the mold, the plurality of first concave portions having opening widths equal to or larger than 1 µm and equal to or smaller than 300 µm, the plurality of second concave portions having opening widths equal to or larger than 10 nm and equal to or smaller than 1 µm.

Further features of the present invention will become apparent from the following description of exemplary embodiments with reference to the attached drawings.

BRIEF DESCRIPTION OF THE DRAWINGS

FIG. 17 is a table illustrating properties of samples of resin components of an example of the present invention.

FIG. 30 is a table illustrating properties of samples of resin components of an example of the present invention.

DESCRIPTION OF THE EMBODIMENTS

Hereinafter, an embodiment of the present invention will be described with reference to the accompanying drawings. Here, since configurations described below are merely examples, detailed configurations may be changed as appropriate by a person skilled in the art, without departing the spirit of the present invention. In addition, numerical values described in the present embodiment are examples, and not intended to limit the present invention.

Figure 1A:
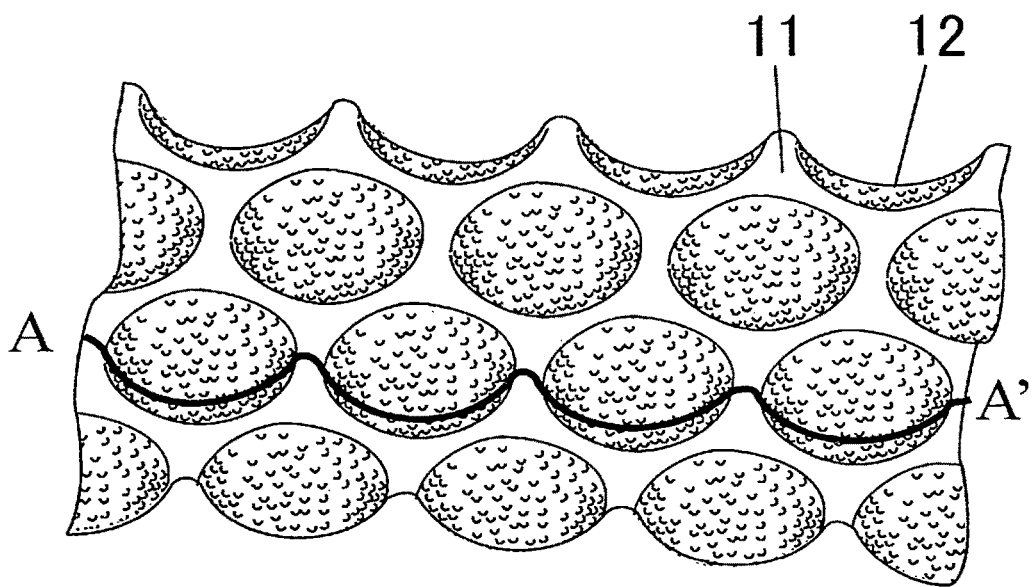
FIG. 1A is a perspective view schematically illustrating an antireflection portion of one embodiment of the present invention.
Figure 1B:
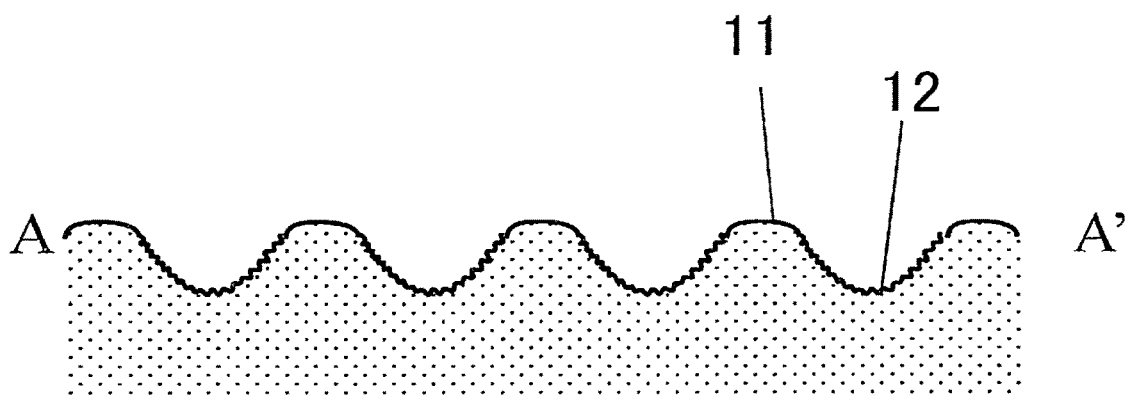
FIG. 1B is a cross-sectional view schematically illustrating the antireflection portion of the one embodiment of the present invention.

A resin product of the present embodiment is a resin component. FIGS. 1A and 1B schematically illustrate an antireflection surface of the resin component of the present embodiment. FIG. 1A is a perspective view schematically illustrating the resin component. FIG. 1B illustrates a cross section of the resin component, taken along a line A-A' of FIG. 1A. In FIGS. 1A and 1B, the antireflection surface of the resin component includes a free surface 11 and first concave portions 12.

Here, the term "free surface" is used herein for convenience to refer to the free surface 11 formed on the antireflection surface of the resin product. Specifically, when a resin product is injection-molded by using a mold, some molten resin injected into the cavity does not contact the mold surface, and solidifies with its free-surface shape without forming the mold-surface shape in the cavity. Thus, the free surface is the surface of the solidified resin with its free-surface shape. That is, the free surface herein is a portion of the outer surface of the resin component, and the portion has solidified while the shape of the mold has not been transferred to the portion.

When a resin component of the present embodiment is molded, the shape of the mold is transferred onto the resin material to form the antireflection surface. The shape of the mold may be transferred onto the resin material by using any method, such as injection molding or roll molding as described in a later-described second example. By using any one of these molding methods, and by setting a condition of molding (e.g. value of pressure applied to the resin material) required to transfer the shape of the mold, the molding can be controlled so that a free surface is formed such that one portion of the resin material does not contact the mold surface.

For example, in a case where the shape of the antireflection surface is formed through injection molding, when the shape of the mold is to be transferred to the resin material, the resin material is injected into the mold under a condition that allows some resin material to not contact the mold surface for forming a free surface. The injection molding is performed by appropriately selecting the resin material and adjusting the temperature and the injection pressure of the resin material. Here, the free surface 11 may not be flat, and may be convex, concave, or waved. If the free surface 11 is waved, the waved free surface may include concave portions and convex portions. Heights of portions of the free surface 11 may be different from an average height of the antireflection surface of the resin component, and from a height of bottom surfaces of first concave portions 12. Preferably, the free surface 11 includes convex portions each formed like a saddle, to improve durability of the antireflection surface and facilitate light scattering performance on the antireflection surface for improving antireflection performance of the antireflection surface.

In FIG. 1A, the first concave portions 12 are disposed with regularity so as to form a honeycomb structure or a staggered arrangement. However, since FIG. 1A is merely intended to simplify the structure of the first concave portions 12 or facilitate the understanding of the first concave portions 12, the first concave portions 12 may not be disposed with regularity. For example, the first concave portions 12 may be randomly or irregularly disposed, as illustrated in a later-described electron-microscope image. Preferably, the first concave portions 12 are randomly or irregularly disposed for increasing the light scattering performance on the antireflection surface to improve the antireflection performance.

Figure 2:
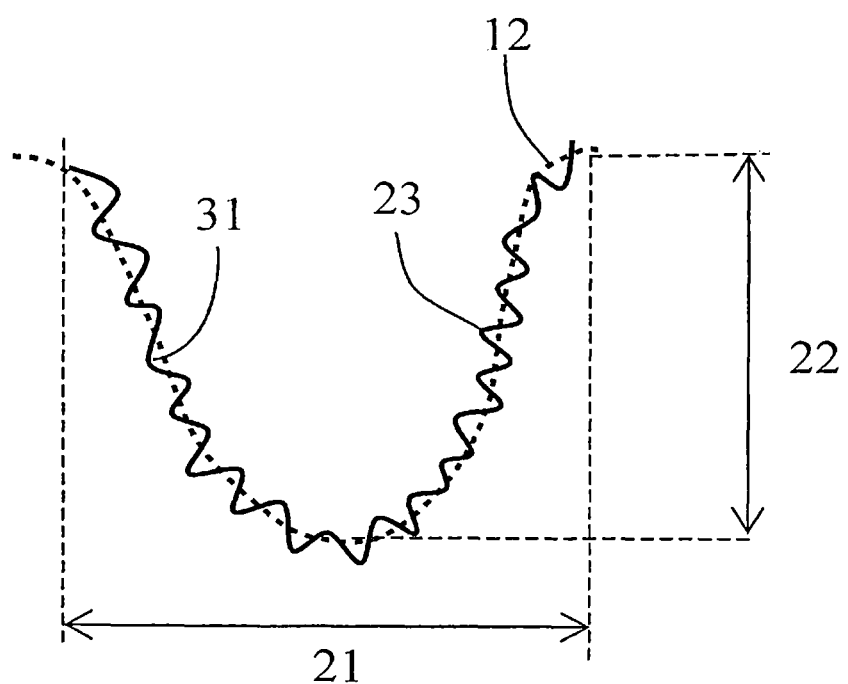
FIG. 2 is a cross-sectional view in which one portion of FIG. 1B is enlarged.

FIG. 2 is a cross-sectional view in which one portion of the first concave portions 12 of FIG. 1B is enlarged. On each of the first concave portions 12, second concave portions 31 are formed. The second concave portions 31 form a fine rough surface 23. In FIG. 2, an outline of the cross section of each of the first concave portions 12 is indicated by a broken line. The broken line can be obtained by image-processing (e.g. low-pass filtering) the cross-sectional image and tracing average values of the fine rough surface 23. Each of the first concave portions 12 has the outline indicated by the broken line, and has a concave shape having an opening width 21 and a depth 22. In the present embodiment, the ratio of the opening width 21 to the depth 22 is defined as an aspect ratio of the first concave portions 12.

In FIGS. 1B and 2, each of the first concave portions 12 has a tapered cross-sectional shape in which the diameter of a cross section of each of the first concave portions 12 decreases as each of the first concave portions 12 extends downward. However, the first concave portions 12 may have any cross-sectional shape, and cross-sectional shapes of the first concave portions 12 may be different from each other and formed with irregularity. For example, the first concave portions 12 may have a rectangular cross-sectional shape, or have a teardrop-shaped cross-sectional shape. The latter is a shape that starts to widen toward the bottom at a predetermined depth. When cross-sectional shapes of the first concave portions 12 are different from each other, the opening width 21 of each of the first concave portions 12 may be measured and evaluated by using a method described later with reference to FIG. 4. The same holds true for the depth 22 of the first concave portions 12.

The surface of each of the first concave portions 12 of the resin component is actually not a smooth surface as is illustrated by the broken line of FIG. 2, but the fine rough surface 23 that includes the plurality of fine concave portions (second concave portions 31).

Figure 3:
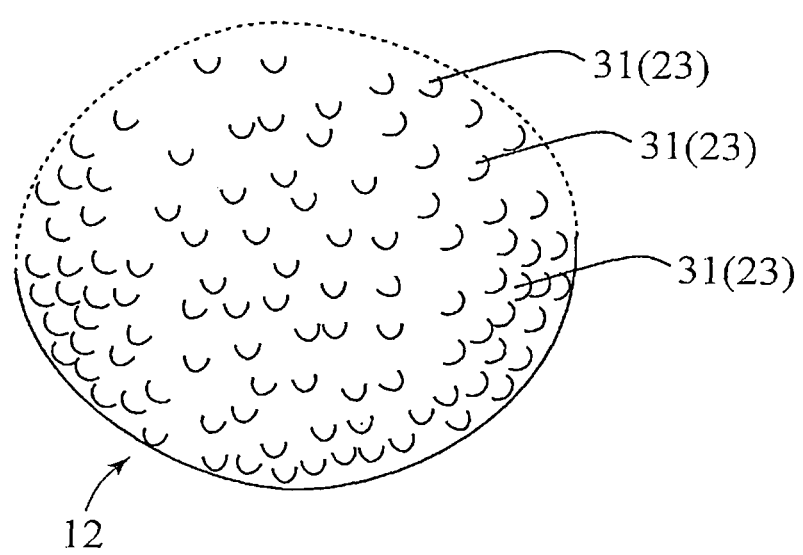
FIG. 3 is a perspective view in which one portion of FIG. 1A is enlarged.

FIG. 3 is a perspective view in which one portion of the first concave portions 12 is enlarged. FIG. 3 illustrates the second concave portions 31. The second concave portions 31 each have an opening width of 1 μm or less, and are formed on the first concave portions 12 along the outline of the first concave portions 12. Here, although the second concave portions 31 are discretely formed in FIGS. 1A and 3, the second concave portions 31 may not necessarily be formed discretely. For example, the second concave portions 31 may be densely formed as illustrated in FIG. 2, or adjacent ones of the second concave portions 31 may partly overlap with each other.

The fine rough surface 23 have only to have concave portions and convex portions formed on the outline of the surface of the first concave portions 12, as illustrated in FIG.

2. In other cases, only concave portions may be formed on the surface (indicated by the outline) of the first concave portions 12, or only convex portions may protrude from the surface (indicated by the outline) of the first concave portions 12. When the convex portions protrude from the surface (indicated by the outline) of the first concave portions 12, the surface (indicated by the outline) of the first concave portions 12 will serve as concave portions with respect to the convex portions. As can be seen from FIGS. 2 and 3, the opening width of the second concave portions 31 is smaller than the opening width 21 of the first concave portions 12. The opening width of the second concave portions 31 is evaluated by using an observation image that is magnified about 10,000 times by an electron microscope or the like.

Figure 4:
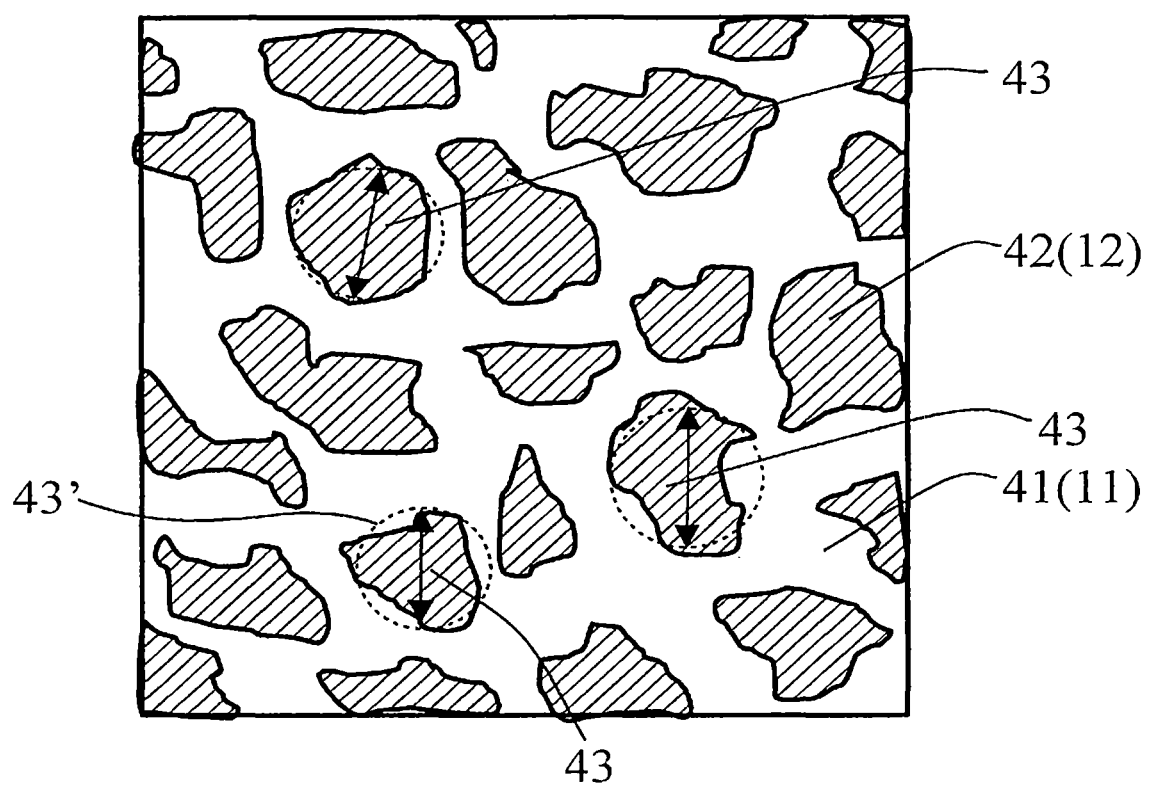
FIG. 4 is a plan view of a resin component of one embodiment of the present invention.

FIG. 4 schematically illustrates a binarized enlarged image obtained by enlarging an image of the antireflection surface of the resin component and binarizing the enlarged image. A method of obtaining such a binarized image will be described later. In FIG. 4, a not-hatched portion 41 is a free surface corresponding to the free surface 11 of FIG. 1. In addition, hatched portions 42 correspond to the first concave portions 12 illustrated in FIGS. 1A to 3. The free surface 41 is formed higher in position than the concave portions 42. As described later, the free surface 41 is a surface of resin material that did not contact the mold when the resin material was injected into the cavity in the transfer (injection) molding that uses the mold.

The first concave portions 42, which correspond to the first concave portions 12, are concave with respect to the free surface 41. Preferably, an opening width 43 of the first concave portions 42 (12) is equal to or larger than 1 μm and equal to or smaller than 300 μm. In addition, the opening width of the second concave portions 31 (FIG. 3), formed on the (hatched) first concave portions 42 (12), is smaller than the opening width 43, and preferably, is equal to or larger than 10 nm and equal to or smaller than 1.5 μm. If the opening width of the second concave portions 31 is within this range, the antireflection surface can efficiently suppress reflection of light having a wavelength smaller than that of the near infrared light.

Typically, the first concave portions 12 are formed, each having random shape and size. Thus, a representative value of the opening width 43 of each of the first concave portions 42 (12) may be measured and evaluated by using the following method. That is, a circle 43', as illustrated in FIG. 4, associated with a corresponding one of the concave portions and minimizing the difference in area between the circle 43' and the corresponding concave portion is determined through image processing on an electron-microscope image, and a diameter of the circle is determined as the representative value of the opening width 43 of the corresponding one of the first concave portions 42 (12).

In an experiment conducted by the present inventors, if the opening width 43 of each of the first concave portions 42 (12) is larger than 300 μm, the reflected light tends to become conspicuous in macroscopic observation and cause flicker of light, because each of the first concave portions 42 (12) has a relatively large area from which the light reflects off. Thus, the opening width 43 of the first concave portions 42 (12) is preferably equal to or smaller than 300 μm.

Figure 5:
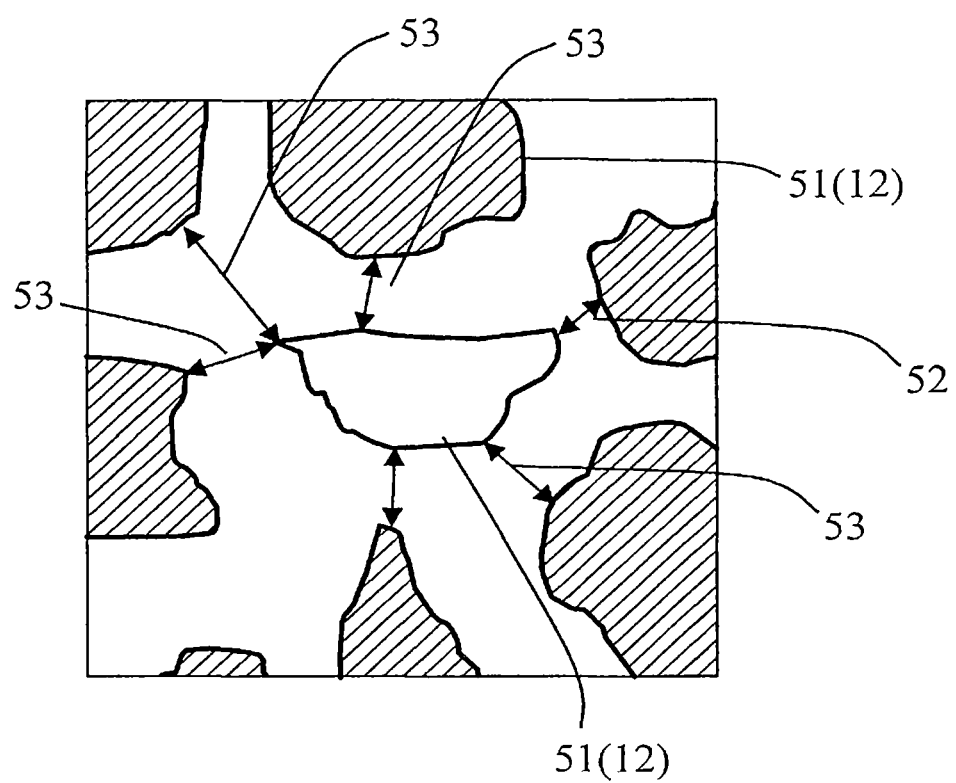
FIG. 5 is a plan view in which one portion of FIG. 4 is enlarged.

FIG. 5 is a diagram in which one portion of the binarized enlarged image of the antireflection surface of FIG. 4 is further enlarged. In FIG. 5, there is a distance 53 between adjacent two ones of first concave portions 51 (12), and the shortest distance of distances 53 is indicated by the reference numeral 52.

Thus, one of the first concave portions 51 (12) has only one shortest distance 52 between the one of the first concave portions 51 (12) and other concave portions surrounding the one of the first concave portions 51 (12). The shortest distance 52 can be measured and evaluated through the following process. For example, by processing an image such as an electron-microscope image, lines are drawn from a target concave portion to other concave portions surrounding the target concave portion such that each line becomes a shortest line. Then, the minimum length of the lines is defined as the shortest distance 52 between the target concave portion and the other concave portions surrounding the target concave portion.

In the present embodiment, the shortest distance 52 of the first concave portions 51 (12) is preferably equal to or smaller than 100 μm. If the shortest distance 52 is larger than 100 μm, the antireflection performance may not be sufficiently exerted because the concave portions are separated too much from each other. More preferably, the shortest distance 52 of the first concave portions 51 (12) is equal to or smaller than 15 μm.

As described above, the antireflection surface of the present embodiment includes the first concave portions 12 having the first opening width 43, and the second concave portions 31 (FIG. 3) formed on the first concave portions 12 and having the second opening width smaller than the first opening width 43. In such a configuration, since the second concave portions 31 are formed, the ratio of the area of the molded product to the area of air in a cross section changes gently at pitches smaller than a wavelength of the near infrared light. As a result, the refractive index of the antireflection surface changes gently, improving the antireflection performance.

In addition, since the first concave portions 12 having the opening width of at least 1 μm are formed on the antireflection surface, incident light with oblique incidence angle will be reflected many times off from the first concave portions 12, and thereby attenuated, which increases the antireflection performance of the antireflection surface. Here, since the light is more attenuated as the number of reflections increases in the concave portions, it is more preferable that the depth from the free surface 41 to the bottom of the first concave portions 12 is made deeper.

In addition, when the aspect ratio (FIG. 2) of the first concave portions 12 is large, the light with a wide range of incidence angle, ranging from an acute angle to an obtuse angle, can be reflected many times. Thus, as the aspect ratio is increased, more antireflection effect will be produced for oblique incident light. For increasing the antireflection effect for oblique incident light, the aspect ratio is preferably equal to or larger than 0.4. In addition, it is more preferable that the shape of the first concave portions 12 is formed such that the cross section of each of the first concave portions 12 is widened toward the bottom of each of the first concave portions 12, because the shape formed in this manner increases the light-shielding performance. As the aspect ratio of the first concave portions 12 is increased, the light-shielding performance is more improved for oblique incident light.

Each of the first concave portions 12 formed on the antireflection surface is surrounded by other first concave portions 12, via the free surface 41 that is higher in position than the inner surfaces of the first concave portions 12. This configuration can protect the second concave portions 31 (FIG. 3), formed on the inner surfaces of the first concave portions 12 and forming the fine rough surface, when the antireflection surface is touched for example.

In contrast, in the conventional configuration as described in Japanese Patent Application Publication No. 2015-184428, although the fine rough surface is formed on the waved antireflection surface, the free surface 41 that is higher in position than the first concave portions 12 is not formed. As a result, the fine rough surface will be easily damaged. Thus, in the conventional configuration, when the antireflection surface is wiped for cleaning, the convex portions of the fine rough surface may be broken, producing dust, and the dust may enter the concave portions of the fine rough surface, deteriorating the antireflection performance of the antireflection surface.

In the present embodiment, however, since the second concave portions 31 that form the fine rough surface are formed on the inner surfaces of the first concave portions 12 surrounded by the higher free surface 41, the fine rough surface is hardly damaged even when wiped, and thus can prevent the deterioration of the antireflection performance of the antireflection surface.

Figure 6:
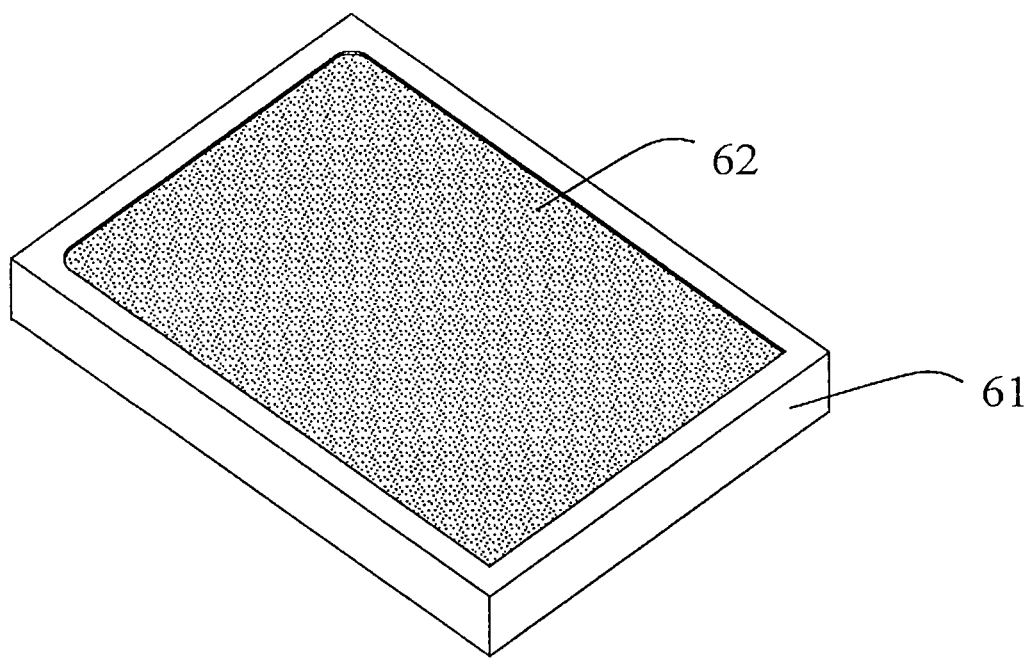
FIG. 6 is a perspective view illustrating one example of the whole structure of a resin component of one embodiment of the present invention.

FIG. 6 is a perspective view of a resin component 61 having an antireflection surface 62 of the above-described embodiment. The resin component 61 of FIG. 6, in particular, the antireflection surface 62 can be formed by transferring the shape of a surface of a mold to a resin material. The molding in which the shape of the surface of the mold is transferred may be performed by using any transfer method, such as injection molding, roll molding, or press molding.

The resin component 61 can be formed in any shape, such as a thin flat shape like a sheet or a film or a curved shape. In FIG. 6, the resin component 61 is a rectangular flat component, as an example, for facilitating the understanding. However, the resin component 61 can be formed in any shape as a supporting member or a housing member, depending on the shape of the mold. Here, the supporting member or the housing member may be a mirror holder or a lens barrel to house optical elements, and needs the light-shielding performance and the antireflection property for optical devices, as described later.

The resin material of the resin component 61 may be a thermoplastic material, such as polyethylene, polystyrene, polypropylene, polyvinyl chloride, polyester, polyamide, or polycarbonate. In addition, the resin material of the resin component 61 may be transparent or colored, and may be a high-strength resin material containing glass filler or carbon fiber.

Figure 28:
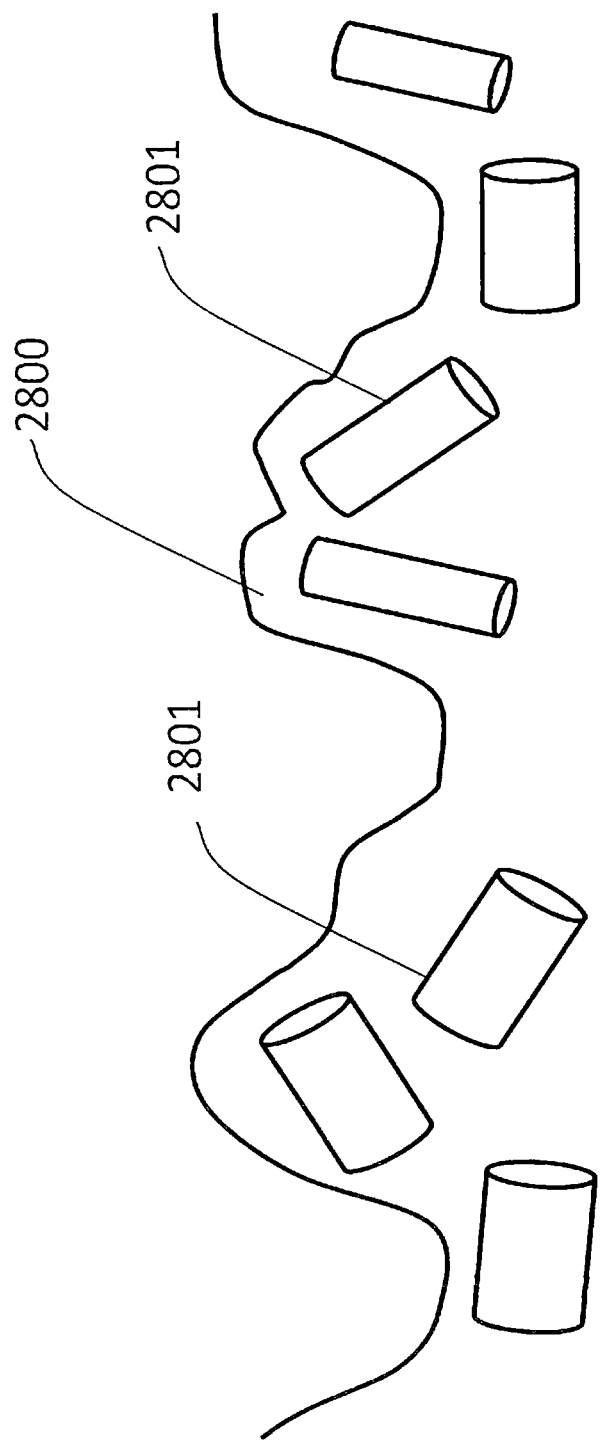
FIG. 28 is a diagram schematically illustrating filler added to a resin component of the present invention.

When the filler is added to the resin material used for the injection molding, the antireflection effect can be more increased. FIG. 28 illustrates an enlarged cross section of the antireflection surface 62 of the resin component 61 to which the filler is added. In FIG. 28, a resin 2800 and filler particles 2801 are illustrated. When the filler particles 2801 are added, the filler particles 2801 move closer to the outer surface of the resin component, that is, to a position near to the free surface. Thus, the filler particles 2801 cause the free surface to be waved at high frequency, improving the scattering effect of light.

The content of the filler is preferably equal to or larger than 5 mass percent and equal to or smaller than 45 mass percent, to the resin material of the resin component. If the content of the filler is less than 5 mass percent, the free surface is less waved, possibly producing insufficient scattering effect. On the other hand, if the content of the filler is larger than 45 mass percent, the moldability may be reduced. For example, when the moldability is reduced in injection molding, the fluidity of resin is reduced, possibly causing deterioration in external appearance, such as short or sink mark.

The shape of particles of the filler may be long and cylindrical. In this case, it is preferable that the diameter of particles of the filler is equal to or larger than 20 μm and equal to or smaller than 80 μm, and the length of particles of the filler is equal to or larger than 70 μm and equal to or smaller than 100 μm. If the diameter of particles of the filler is less than 20 μm or the length of particles of the filler is less than 70 μm, the filler may project from the free surface when pressed to move toward the free surface, possibly deteriorating the external appearance. On the other hand, if the diameter of particles of the filler is larger than 80 μm or the length of particles of the filler is larger than 100 μm, the free surface may be insufficiently waved because the filler is not pressed to move closer to the free surface.

Preferably, the free surface is waved such that an arithmetic average curvature Spc, which is two-dimensionally evaluated for peaks of a wave-shaped portion of the free surface, is equal to or larger than 1500 [1/mm] and equal to or smaller than 9000 [1/mm]. When the arithmetic average curvature Spc of peaks of a wave-shaped portion is within the above-described range, the resin component 61 can have better antireflection performance.

Figure 29:
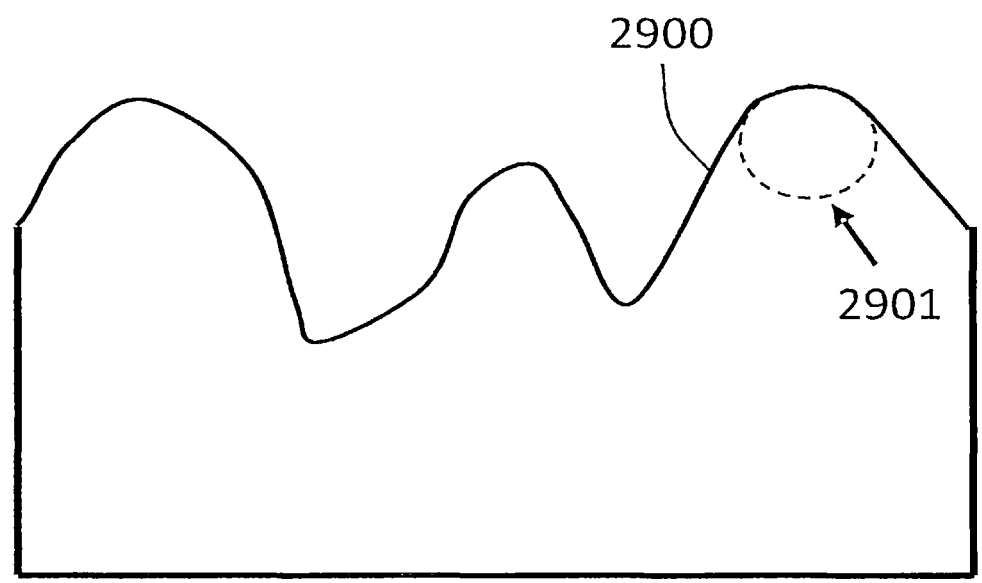
FIG. 29 is a diagram illustrating an effect of the filler added to the resin component of the present invention.

Here, the arithmetic average curvature Spc of peaks of a wave-shaped portion of the free surface will be described. The arithmetic average curvature Spc of peaks is an average value of principal curvatures of peaks of a wave-shaped portion of the free surface. FIG. 29 is a cross-sectional view of concave and convex portions of the free surface, intended to describe the arithmetic average curvature Spc of peaks of a wave-shaped portion 2900 of the free surface. A measurement area illustrated in FIG. 29 has a size of about 1000× 1000 μm. The following equation expresses an equation to calculate the arithmetic average curvature Spc of the peaks. In this equation, a parameter z indicates a height component obtained at positional coordinates (x, y), and a parameter n indicates the number of peaks. Thus, the arithmetic average curvature Spc of the peaks is an average value of reciprocals of radiuses of approximate circles 2901 of the peaks of the wave-shaped portion of FIG. 29. Thus, when the arithmetic average curvature Spc is small, the peaks are round and wide; when the arithmetic average curvature Spc is large, the peaks are sharp and narrow.

$$Spc = -\frac{1}{2}\frac{1}{n}\sum_{k=1}^{n}\left(\frac{\partial^2 z(x, y)}{\partial x^2} + \frac{\partial^2 z(x, y)}{\partial y^2}\right) \quad (1)$$

Here, when the arithmetic average curvature Spc of the peaks is larger than 9000 [1/mm], the convex portions of the wave-shaped portion of the free surface are acute and narrow. The convex portions allow the incident light on the molded product to be easily reflected and scattered, probably improving the antireflection performance. However, as the convex portions of the wave-shaped portion of the free surface become more acute, the durability against wiping tends to deteriorate more.

On the other hand, when the arithmetic average curvature Spc of the peaks is smaller than 1500 [1/mm], more light is reflected off from the wave-shaped portion of the free surface, possibly deteriorating the effect of the filler contained in the resin material. Thus, the convex portions of the wave-shaped portion of the free surface are preferably formed such that the arithmetic average curvature Spc is equal to or larger than 1500 [1/mm] and equal to or smaller than 9000 [1/mm].

The mold used to mold the resin component 61 can be made by roughening a surface of the mold by irradiating the surface of the mold with short-pulse laser having a pulse width of $10^{12}$ second or less. When the pulse width of the laser used for machining is $10^{12}$ second or less, the laser causes self-organization of the surface of the mold, and thereby can efficiently roughen the surface of the mold. With such laser machining, fine projections can be formed on the surface of the mold. The shape of the fine projections of the mold is then transferred to the resin material to form the fine rough surface 23, which has the second concave portions 31 formed on the inner surfaces of the first concave portions 12, as illustrated in FIG. 3.

Figure 7:
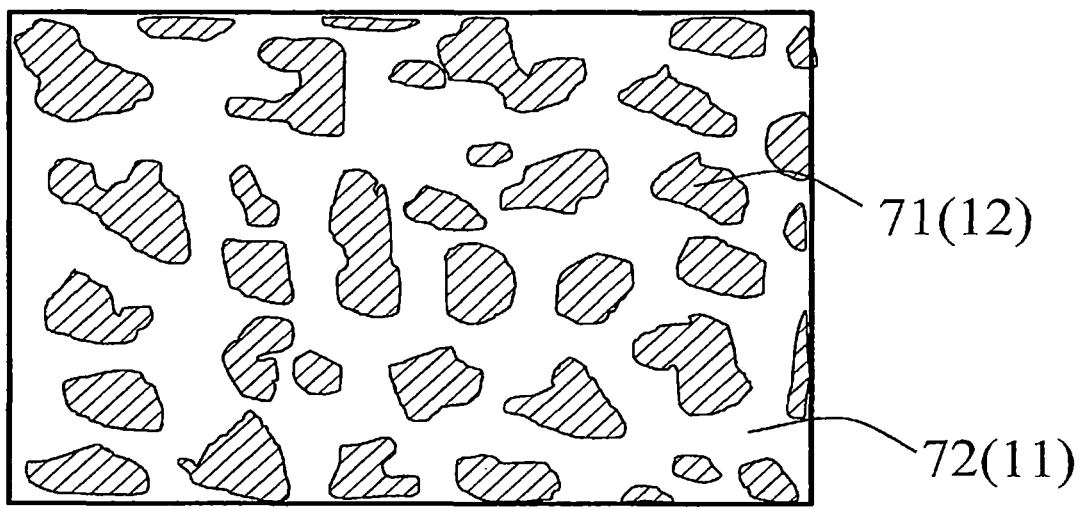
FIG. 7 is a plan view of a resin component of one embodiment of the present invention.

FIG. 7 illustrates a binarized image of the antireflection surface 62 of the resin component 61 of FIG. 6, captured by an electron microscope. In FIG. 7, first concave portions 71 (12) and a free surface 72 are illustrated. Each of the first concave portions 71 (12) is surrounded by the free surface 72. When the ratio of the area of the first concave portions 71 (12) to the area of the whole of the antireflection surface 62 is small, that is, when the free surface is large, the reflectivity increases while the durability improves. On the other hand, when the ratio of the area of the first concave portions 71 (12) to the area of the whole of the antireflection surface 62 is large, the reflectivity decreases while the durability lowers. The ratio of the area of the first concave portions 71 (12) to the area of the whole of the antireflection surface 62 is preferably equal to or larger than 10% and equal to or smaller than 95%, because the antireflection performance significantly decreases when the ratio is less than 10%. More preferably, the ratio of the area of the first concave portions 71 (12) to the area of the whole of the antireflection surface 62 is equal to or larger than 50% and equal to or smaller than 80%, because the durability and the antireflection performance are well balanced in this range. Hereinafter, specific examples for configuration, use, and manufacturing method of the resin component of the present embodiment will be described.

First Example

Figure 8:
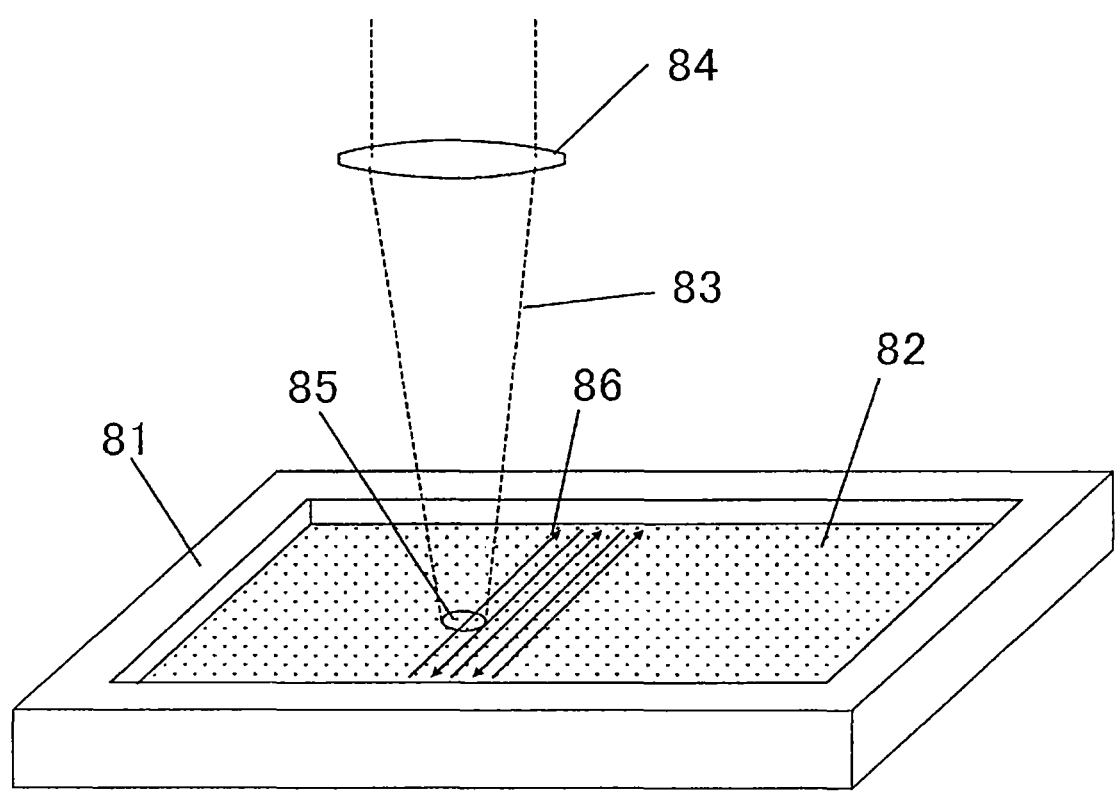
FIG. 8 is a diagram illustrating a process to roughen a surface of a mold.

In a first example, manufacturing processes of a mold to mold a resin component and a method to evaluate the molded resin component will be described. First, as illustrated in FIG. 8, a mold surface 82 whose shape is to be transferred to an antireflection surface of a resin component is roughened by irradiating the mold surface 82 with the above-described short-pulse laser. A mold 81 illustrated in FIG. 8 may be made of any material, such as stainless cupper or aluminum, which is suitable for molding processes performed after the roughening process.

The short-pulse laser, which is different from the laser that performs continuous irradiation, repeats short-time irradiation. A short-pulse laser that performs irradiation for a period of time from a few picoseconds to several hundred picoseconds is called a picosecond laser. A short-pulse laser that performs irradiation for a period of time from a few femtoseconds (shorter than one picosecond) to several hundred femtoseconds is called a femtosecond laser. In the first example, the picosecond laser or the femtosecond laser can be suitably used. In a later-described laser machining, the surface of the mold is roughened, preferably, by irradiating the surface of the mold with the pulse laser having a pulse width of $10^{-12}$ second or less (subpicoseconds). In the first example, a laser machining apparatus used is an apparatus whose settings, such as laser irradiation intensity, pulse length, and pulse interval, can be freely selected.

The laser machining apparatus may be an ultrashort-pulse laser oscillator made by AMPLITUDE SYSTEMS. The ultrashort-pulse laser oscillator generates a laser 83 used for machining. The wavelength of the laser 83 is 1030 nm, and the pulse width of the laser 83 is 500 femtoseconds (fs). The pulse energy of the laser 83 produced per one pulse is 40 µJ, and the focal length of a lens 84 is about 170 mm. The spot diameter of an irradiation area 85 can be adjusted into 40 µm by adjusting the distance between the lens 84 and the mold surface.

With these parameters, the area of the irradiation area 85 is about $(1.3 \times 10^{-3} \text{ mm})^2$, and the energy density of one pulse of the laser is about 30 $kJ/m^2$ at the irradiation area 85. An area of the mold surface 82 to be roughened is scanned by the laser by moving the mold by using a scanning stage (not illustrated).

An arrow 86 of FIG. 8 indicates a trace along which the laser 83, used for machining, scans the mold surface 82. The speed at which the laser 83 scans the mold surface 82 is 30 mm/s, the scan interval is 20 µm, and the irradiation frequency of the short-pulse laser is 500 kHz. One irradiation area is irradiated with about 1,000 pulses of the pulse laser.

The number N of pulses of the pulse laser with which one irradiation area is irradiated can be determined from the following equation. In the equation, a parameter V [mm/s] is a speed at which the laser scans the mold surface 82, a parameter L [mm] is a scan interval, a parameter S [mm$^2$] is an area of the irradiation area 85, and a parameter f [times/s] is an irradiation frequency of the short-pulse laser.

$$N = f \cdot S / (V \cdot L)$$

Here, the scan interval L is smaller than the spot diameter of the irradiation area 85, and is typically nearly half the spot diameter. In addition to the number of irradiation pulses, there may be controlled other irradiation conditions of the laser, including the pulse width of the laser, and the energy density at the irradiation area. Thus, by appropriately selecting these irradiation conditions, a special rough surface that is difficult to achieve through a cutting process can be formed on the surface of the mold.

Figure 18:
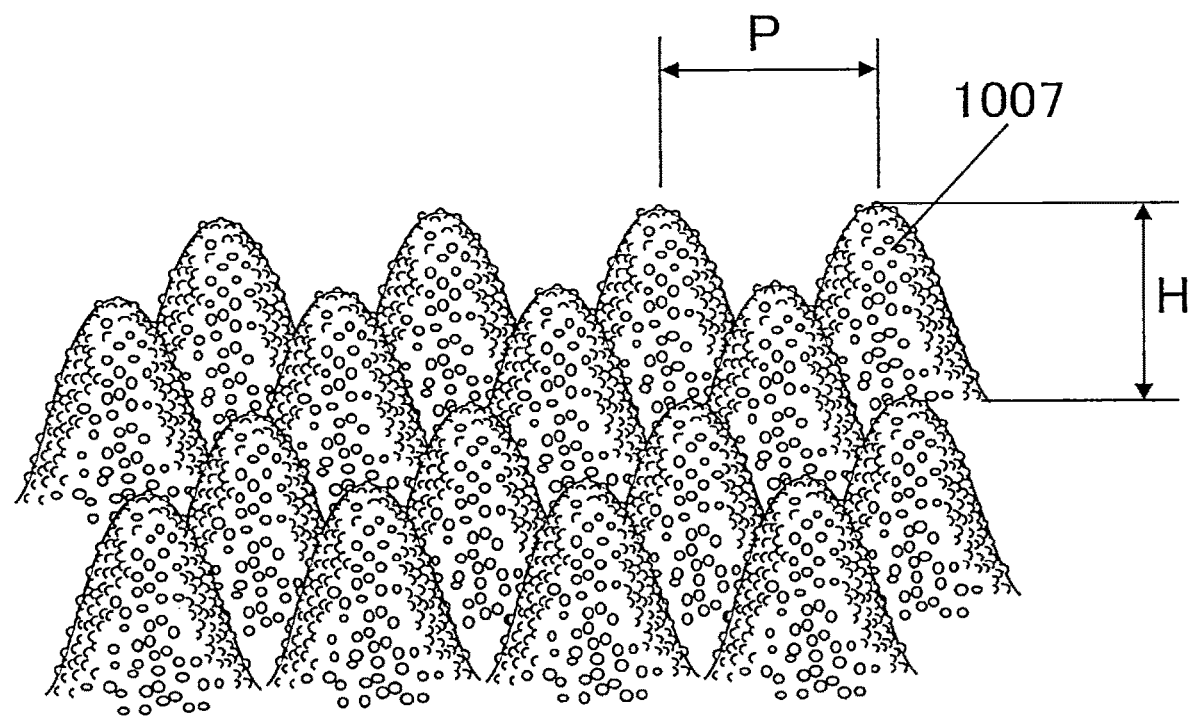
FIG. 18 is a diagram illustrating a roughened surface of a mold of one embodiment of the present invention.

When the mold surface 82 of the mold 81, on which the laser machining was performed with the above-described conditions, was observed through an electron microscope, there was obtained a fine rough surface having a convex-and-concave structure as illustrated in an electron-microscope image. FIG. 18 is a perspective view schematically illustrating the convex-and-concave structure of the mold surface 82. With the above-described conditions on laser machining, a pitch P between adjacent two convex portions 1007 (FIG. 18) of the convex-and-concave structure is equal to or larger than 20 µm and equal to or smaller than 40 µm, and a height H of the convex portions 1007 of the convex-and-concave structure is equal to or larger than 50 µm and equal to or smaller than 80 µm. Here, the shape of bottom portions of the first concave portions 12 of the resin component is formed in accordance with top portions of the convex portions 1007 of the convex-and-concave structure of the mold surface 82. In the convex-and-concave structure constituted by the plurality of convex portions 1007, the convex portions 1007 are formed at pitches larger than a wavelength of the visible light. In accordance with the irradiation conditions on the short-pulse laser, the pitch P can be changed in a range from 10 to 100 µm, and the height H can be changed in a range from 10 to 100 µm. In addition, a steep convex-and-concave structure in which the pitch P is nearly equal to the height H may be used in accordance with intended use.

In the fine rough surface illustrated in FIG. 18, fine concave and convex portions were formed on the convex-and-concave structure of the mold surface 82, in particular, on the convex portions 1007 so as to cover the surface of the convex portions 1007. The pitch of the fine concave and convex portions was equal to or larger than 40 nm and equal to or smaller than 80 nm, and the height of the fine concave and convex portions was equal to or larger than 40 nm and equal to or smaller than 80 nm. The second concave portions 31 on the inner surfaces of the first concave portions 12 of the resin component are formed in accordance with the fine concave and convex portions that covers the surface of the convex portions 1007 of the mold surface 82. Thus, in accordance with the conditions on laser machining, the convex-and-concave structure, including the plurality of convex portions 1007 and the fine concave and convex portions that covered the surface of the convex portions 1007, is formed on the mold surface 82. That is, the mold surface 82 is given the special shape in which the large convex-and-concave structure and the small concave and convex portions are combined. The large convex-and-concave structure is used to form the first concave portions 12 of the resin component, and the small concave and convex portions are used to form the second concave portions 31 of the resin component.

In this manner, the first convex portions having a diameter of 1 μm or more, and the second convex portions having a diameter equal to or larger than 10 nm and equal to or smaller than 1 μm can be formed on a molding surface of the mold.

Although the mechanism of the development of the special shape of the mold surface 82, in which the convex-and-concave structure and the fine projections are combined as illustrated in FIG. 18, is not fully known, a general process of the development will be described below.

Figure 19A:
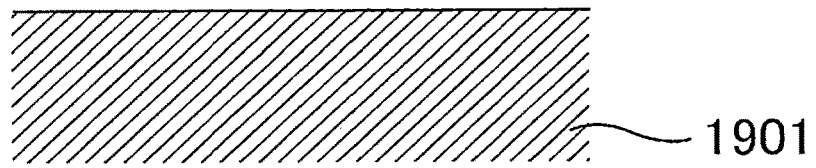
FIG. 19A is a diagram illustrating a state in which a surface of a mold of one embodiment of the present invention has still not been irradiated with pulse laser.

FIG. 19A illustrates a cross section of a mold 1901 that is still not irradiated with the pulse laser. In this stage, since the mold surface has been machined into a flat surface or a mirror surface through a preparatory process, there are no conspicuous concave and convex portions on the mold surface.

Figure 19B:
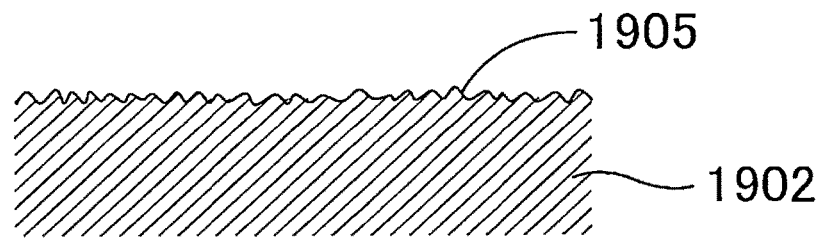
FIG. 19B is a diagram illustrating a state in which the surface of the mold has been irradiated with a few pulses of the pulse laser.

FIG. 19B illustrates a cross section of a mold 1902 that has been irradiated with a few pulses of the pulse laser. In this stage, since some metal of the mold has evaporated from the mold surface and some metal has aggregated on the mold surface, concave and convex portions 1905 are formed. In this stage, the depth of the concave and convex portions is several tens of nanometers.

Figure 19C:
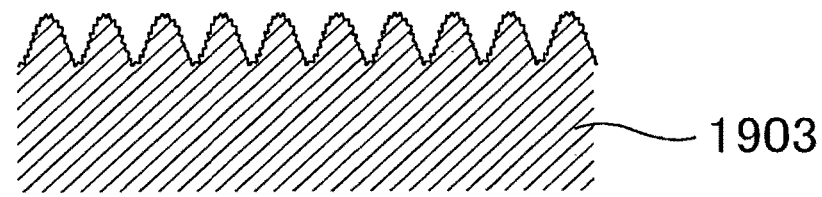
FIG. 19C is a diagram illustrating a state in which the surface of the mold has been irradiated with several tens of pulses of the pulse laser.

FIG. 19C illustrates a cross section of a mold 1903 that has been irradiated with several tens of pulses of the pulse laser. In this process, more metal evaporates from portions of the mold surface that are more concaved. As a result, a convex-and-concave structure illustrated in FIG. 19C develops. During this process, some metal aggregates and forms small lumps on the surface of the convex-and-concave structure, and the lumps become projections. In this stage, the depth of the concave and convex portions is a few micro meters.

Figure 19D:
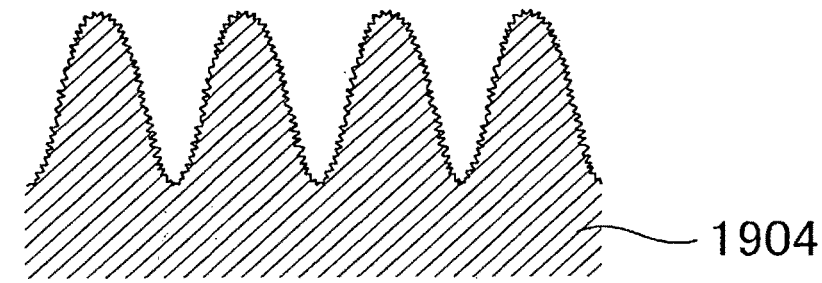
FIG. 19D is a diagram illustrating a state in which the surface of the mold has been irradiated with several hundreds of pulses of the pulse laser.

FIG. 19D illustrates a cross section of a mold 1904 that has been irradiated with several hundreds of pulses of the pulse laser. Also in this process, more metal evaporates from portions of the mold surface that are more concaved. As a result, lower convex portions disappear, and only higher convex portions are left. As this phenomenon continues, the number of convex and concave portions decreases, and the height between the convex portions and the concave portions increases, as illustrated in FIG. 19D. The surface of the convex-and-concave structure is covered with the small aggregated lumps.

In the above-described manner, the special shape, in which the convex-and-concave structure and the small concave and convex portions are combined as illustrated in FIG. 18, is formed on the mold surface. In this stage, the grown convex-and-concave structure has a pitch of about several tens of micrometers, and a height of about several tens of micrometers. As described above, by using the short-pulse laser to roughen the mold surface, the mold can be machined in short time and at low cost. If the same shape is formed by cutting the mold or using photolithography, it will take time that is several times longer than that taken by the method using the short-pulse laser.

As described above, the mold surface formed by the short-pulse laser and having the special shape produces only a slight amount of reflected light, from incident light with various incidence angles. In addition, as a result of the present inventors' study, the resin component obtained by transferring the shape of the mold surface to the resin material can also be used as a light-shielding member, which suppresses reflection of light. Thus, if the special shape is formed on the mold surface by using the short-pulse laser, and then a resin component (molded product) is made by using the mold, a light-shielding member that suppresses reflection of light and has high performance can be manufactured in short time and at low cost.

FIGS. 9A to 9E illustrate processes to injection-mold a resin component by using a mold 91 made in the above-described manner. Here, the resin component was made by using the injection molding machine J180EL III (product name) made by THE JAPAN STEEL WORKS, LTD. The injection molding machine illustrated in FIGS. 9A to 9E includes a pressure device 911 that communicates with a cylinder 99, and a hopper 910 that supplies resin material.

The cylinder 99 contains a screw (not illustrated), which is rotated by a driving source (not illustrated) such as a motor. With the rotation of the screw, the resin material in the hopper 910 is sent to the leading end of the cylinder 99. In addition, the cylinder 99 is provided with a heater (not illustrated). Thus, when the resin material is supplied from the hopper 910, the resin material is heated in the cylinder 99 on the way to the leading end of the cylinder 99, up to a temperature equal to or larger than a glass transition temperature, and melted into liquid. The molten resin material is stored in space of the leading end of the cylinder 99.

The mold 91 illustrated in FIGS. 9A to 9E corresponds to the mold illustrated in FIG. 18 and having the roughened mold surface. In FIGS. 9A to 9E, a facing mold 98 is used to close the mold 91.

The resin material supplied from the hopper 910 may be polycarbonate G3430H with glass filler, made by TEIJIN LIMITED. In addition, the resin material may be black-colored by using colorant.

Figure 9A:
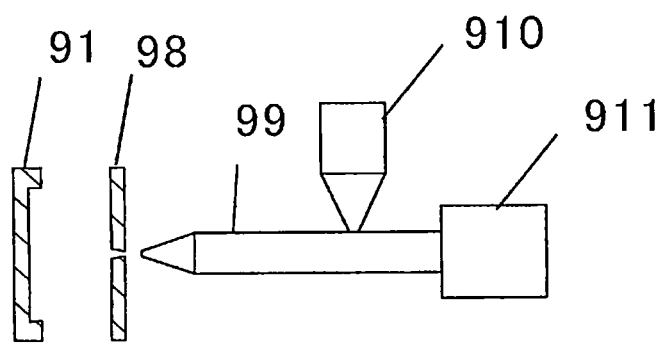
FIG. 9A is a diagram illustrating an injection molding apparatus used to make a resin component of one embodiment of the present invention.
Figure 9B:
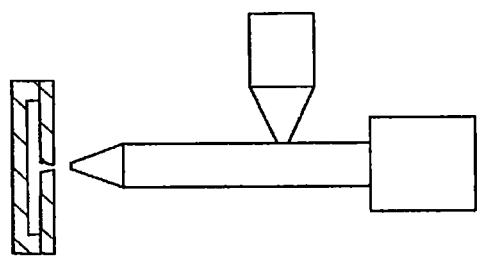
FIG. 9B is a diagram illustrating a process in which a cavity is formed in the injection molding apparatus.

First, as a mold preparatory process, the mold is attached to the injection molding machine, as illustrated in FIG. 9A. Then, as illustrated in FIG. 9B, the mold 91 is closed by using the facing mold 98 by a driving mechanism (not illustrated). Before or while the mold 91 is closed, the mold 91 and the facing mold 98 are heated by a heater (not illustrated). The temperature at which the mold 91 and the facing mold 98 are heated in this process is called a mold temperature.

Figure 9C:
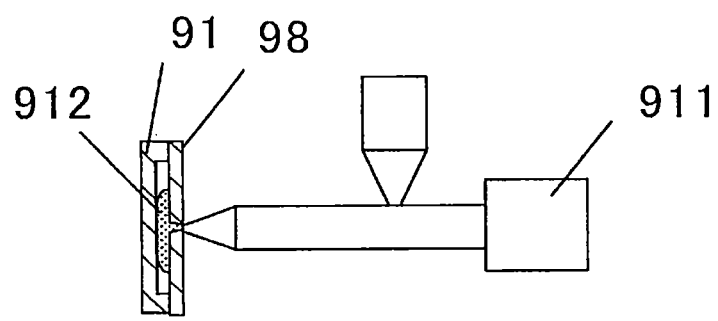
FIG. 9C is a diagram illustrating a process in which resin is injected into the cavity of the injection molding apparatus.
Figure 9D:
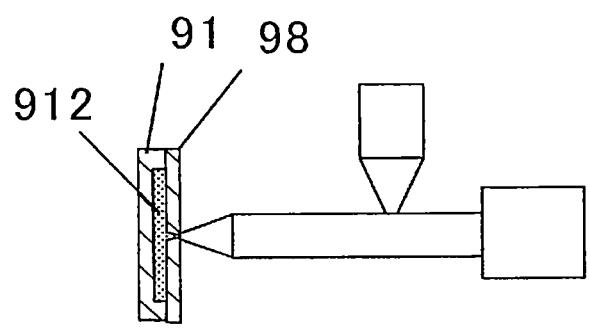
FIG. 9D is a diagram illustrating a process in which the resin is cooled under a constant pressure after injected into the cavity.

Following this process, an injection process of FIG. 9C, and a pressure keeping process and a cooling process of FIG. 9D are performed. In the injection process of FIG. 9C, a molten resin 912 is injected by the pressure device 911, from the cylinder 99 into the cavity formed by the mold 91 and the facing mold 98. The pressure device 911 may include a hydraulic cylinder. In the pressure keeping process and the cooling (solidifying) process of FIG. 9D, the molten resin 912 of the cavity is pressed by the pressure device 911 at a predetermined pressure that allows the free surface 41 to be formed, and the pressure is kept for a predetermined time (pressure keeping process). Thus, the pressure applied to the molten resin 912 inside the cavity, formed by the mold 91 and the facing mold 98, is kept at a later-described constant pressure.

Here, control of the transfer pressure, or the constant pressure, of the present example will be described. In general injection molding, the transfer pressure or the constant pressure is set so that the cavity, formed by the mold 91 and the facing mold 98, is filled with the molten resin 912. In contrast, in the present example, the constant pressure is set so that the cavity is not filled with the molten resin 912. The constant pressure is set in this manner to form the free surface 41 so as to surround the first concave portions 12, and to control the ratio (area ration) of the area of the first concave portions 12 or the free surface 41 to the area of the whole of the antireflection surface. Hereinafter, the control of keeping pressure in the injection molding of the present example will be described with reference to FIGS. 20A to 20D.

FIGS. 20A to 20D schematically illustrate the change in shape of the interface between the mold 91 and the molten resin 912, caused when the constant pressure is changed in the process of FIG. 9D. In FIGS. 20A to 20D, a cross section 2014 of the surface of the mold 91 of FIG. 9 has a shape in which the convex-and-concave structure and the small concave and convex portions are combined through the above-described laser machining of the mold. A molten resin 2012 corresponds to the molten resin 912 of FIG. 9.

Figure 20A:
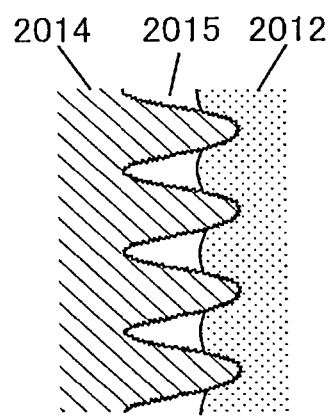
FIG. 20A is a diagram illustrating a state in which molten resin is injected into the mold and kept under a low pressure.
Figure 20B:
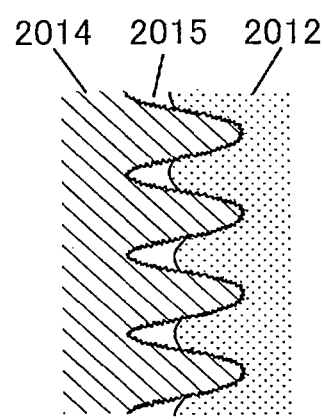
FIG. 20B is a diagram illustrating a state in which molten resin is injected into the mold and kept under an increased pressure.

FIG. 20A illustrates a state under a certain constant pressure. In FIG. 20A, the molten resin 2012 contacts top portions of the convex portions of the mold 2014, but does not contact concave portions of the mold 2014. As a result, a space 2015 is formed between the molten resin 2012 and the mold 2014, in particular, between the molten resin 2012 and the concave portions of the mold 2014. FIG. 20B illustrates a state under a constant pressure higher than that of FIG. 20A. As in FIG. 20A, the molten resin 2012 contacts the convex portions of the mold 2014, but does not contact the concave portions of the mold 2014. As a result, the space 2015 is formed. However, the space 2015 is smaller than that of FIG. 20A.

Figure 20C:
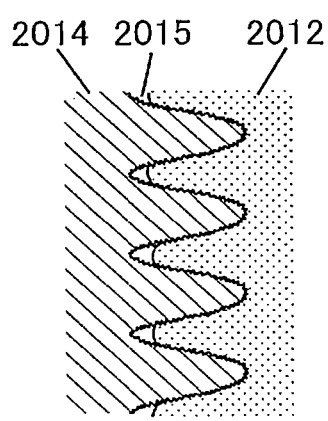
FIG. 20C is a diagram illustrating a state in which molten resin is injected into the mold and kept under a further increased pressure.

FIG. 20C illustrates a state under a constant pressure higher than that of FIG. 20B. As in FIGS. 20A and 20B, the molten resin 2012 contacts the convex portions of the mold 2014, but does not contact the concave portions of the mold 2014. As a result, the space 2015 is formed. However, the space 2015 is smaller than those of FIGS. 20A and 20B. Thus, in the pressure keeping process of the present example, the constant pressure is set so that the space 1015, which is not filled with the molten resin 2012, is formed as in FIGS. 20A to 20C. When the molten resin 2012 does not contact the concave portions of the mold 2014 as illustrated in FIGS. 20A to 20C and the space 2015 is formed, a surface of the molten resin 2012 that faces the space 2015 is not affected by the shape of the mold surface, and becomes the free surface. When the molten resin 2012 is cooled and solidified in such a state, the free surface 41 is formed around the first concave portions 12, having irregular heights and shaped like a saddle. That is, in the present example, the constant pressure is set such that the space 2015 is formed between the molten resin 2012 and the mold 2014, in particular, between the molten resin 2012 and the concave portions of the mold 2014, and that a surface of the molten resin 2012 that faces the space 2015 becomes the free surface.

Figure 20D:
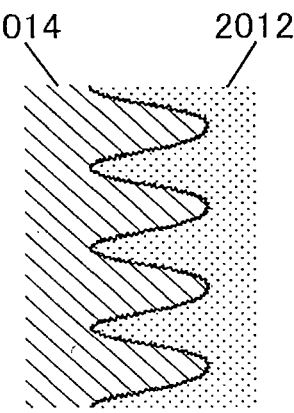
FIG. 20D is a diagram illustrating a state in which molten resin is injected into the mold and kept under an even further increased pressure.

Here, when the constant pressure is further increased, a state illustrated in FIG. 20D is produced. In FIG. 20D, since the molten resin 2012 contacts not only the convex portions of the mold 2014 but also the concave portions of the mold 2014, the space 2015 as illustrated in FIGS. 20A to 20C is not formed. In conventional injection molding, the constant pressure is set such that the state of FIG. 20D is produced. However, such a state is not produced in the present example.

Figure 9E:
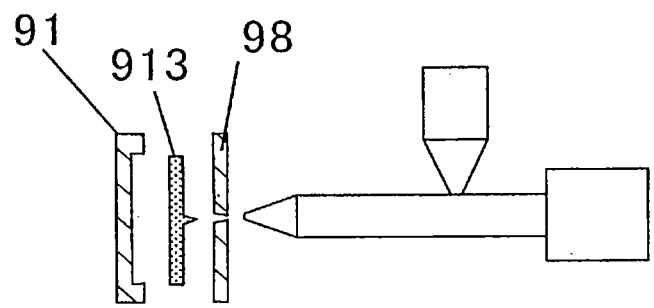
FIG. 9E is a diagram illustrating a process in which the mold is opened to take out the resin component.

Referring again to FIG. 9D, after the molten resin 912 is pressed at a constant pressure for a predetermined time, the mold 91 and the facing mold 98 are cooled, and thereby the molten resin 912 is cooled to a temperature equal to or smaller than a glass transition temperature to change the state of the molten resin 912 from liquid to solid. Here, the mold 91 and the facing mold 98 may be cooled by a mechanism (not illustrated) that circulates coolant around the mold 91 and the facing mold 98. Then, as illustrated in FIG. 9E, the mold 91 is opened and separated from the facing mold 98. The separation may be performed by projecting an ejector pin, passing through the mold 91, into the cavity. Thus, many resin components 913 can be manufactured by repeating the above-described processes.

In the first example, in the injection process of FIG. 9C, the mold temperature is set to 125° C., and the resin temperature is set to 320° C. In the pressure keeping process of FIG. 9D, the pressure device 911 is used, and thereby the molten resin 2012 of the cavity is applied with pressure that allows the concave portions of the mold surface 82 to be not filled with the molten resin 2012. In the pressure keeping process of FIG. 9D, the pressure value is set so that the free surface 41 is formed. Specifically, the pressure value is set so that the free surface is formed without the molten resin 2012 contacting the concave portions of the mold surface 82. As examples, the injection molding was performed under two pressure conditions of 60 MPa and 90 MPa. Through the above-described processes, resin components 913 that include respective antireflection surfaces and that can be used as a light-shielding member were obtained.

Figure 21A:
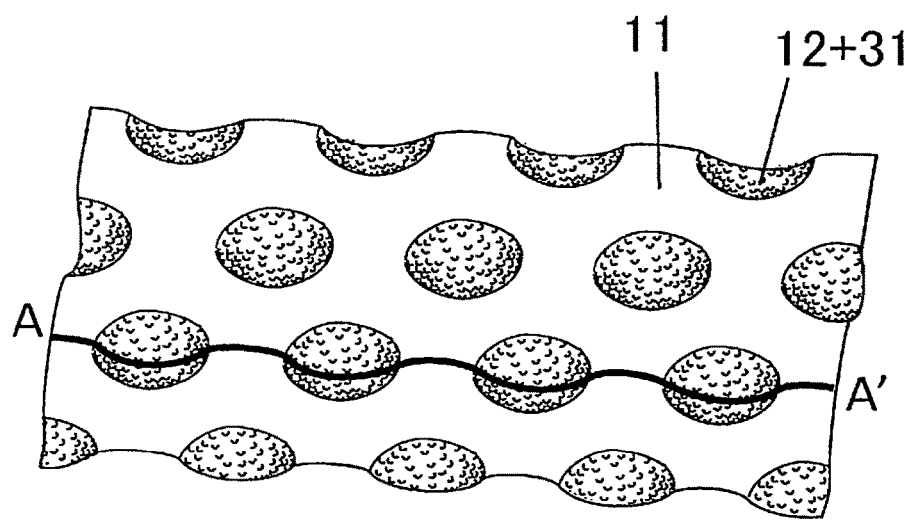
FIG. 21A is a perspective view of a resin component having a large free surface.
Figure 21B:
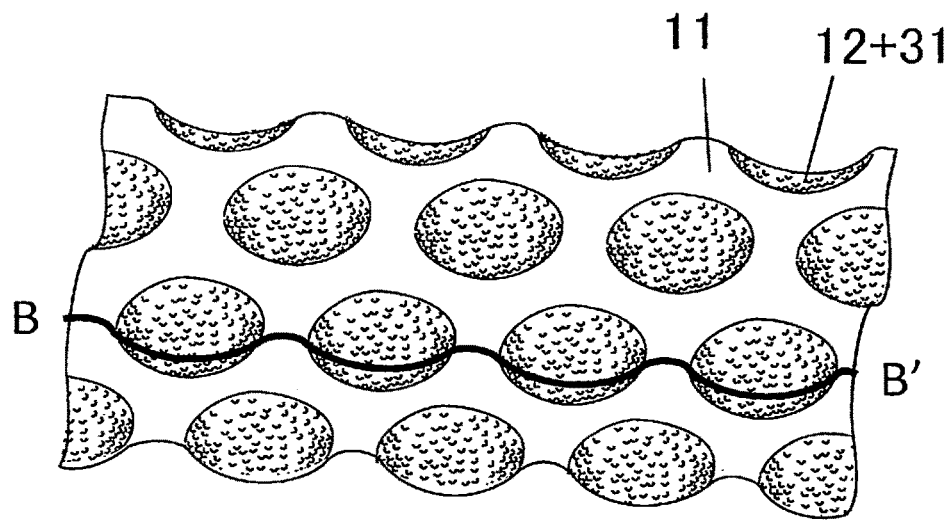
FIG. 21B is a perspective view of a resin component having a medium-size free surface.
Figure 21C:
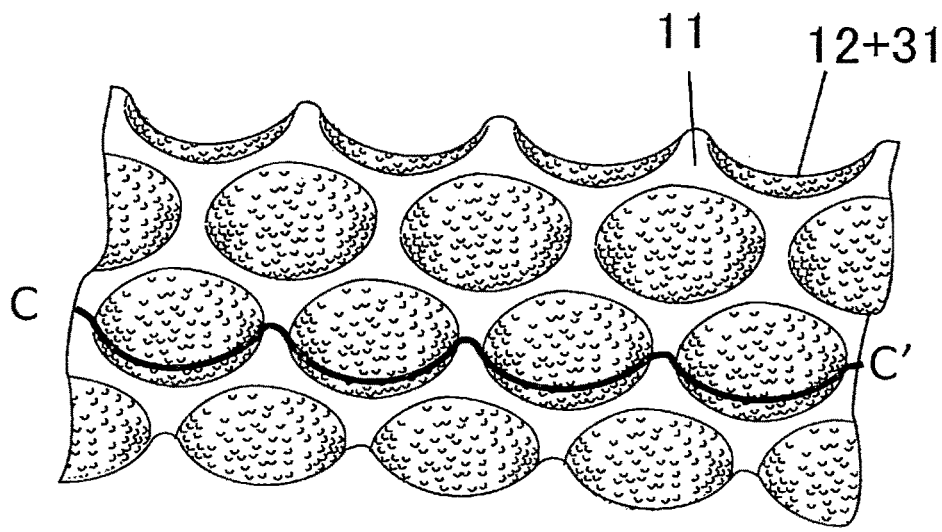
FIG. 21C is a perspective view of a resin component having a small free surface.
Figure 22A:
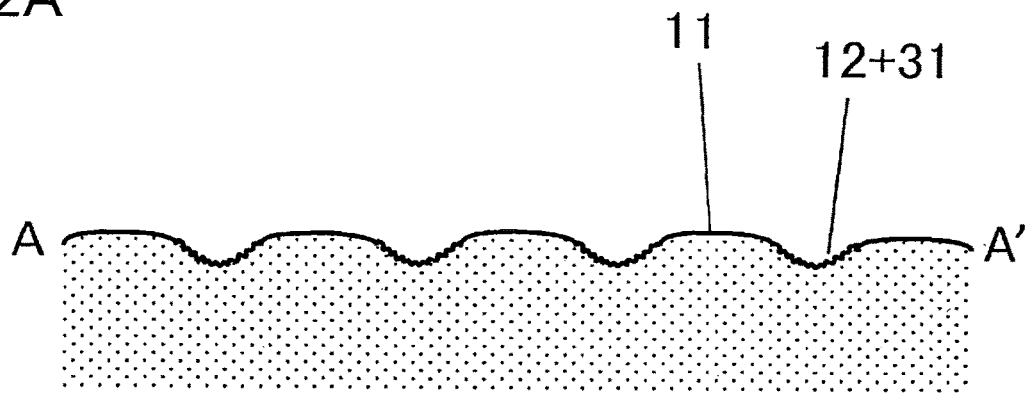
FIG. 22A is a cross-sectional view of the resin component having the large free surface.
Figure 22B:
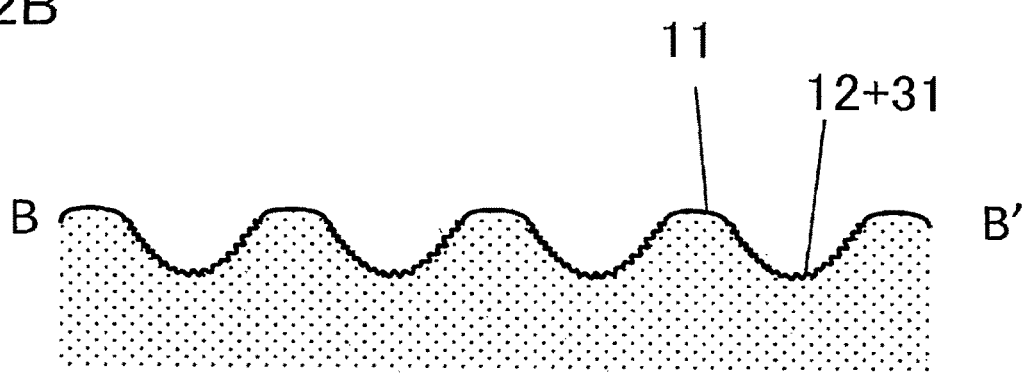
FIG. 22B is a cross-sectional view of the resin component having the medium-size free surface.
Figure 22C:
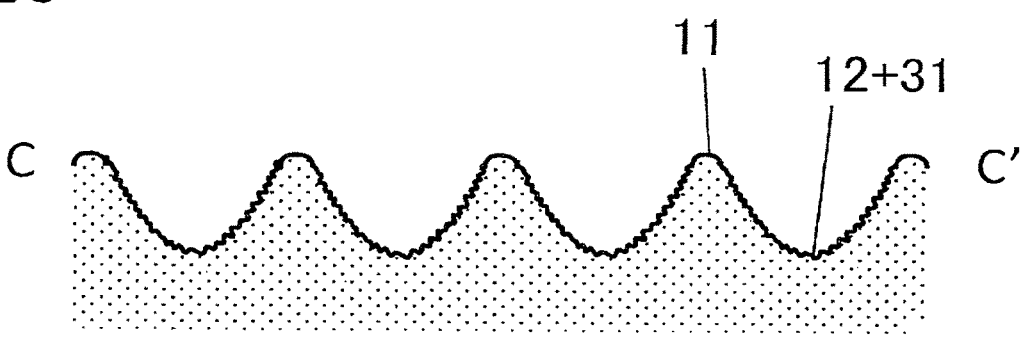
FIG. 22C is a cross-sectional view of the resin component having the small free surface.

FIGS. 21A to 21C and FIGS. 22A to 22C schematically illustrate antireflection surfaces of resin components, suitably produced in the present example. FIG. 22A is a cross-sectional view of an antireflection surface of FIG. 21A, taken along a line A-A' of FIG. 21A. FIG. 22B is a cross-sectional view of an antireflection surface of FIG. 21B, taken along a line B-B' of FIG. 21B. FIG. 22C is a cross-sectional view of an antireflection surface of FIG. 21C, taken along a line C-C' of FIG. 21C.

Figure 11:
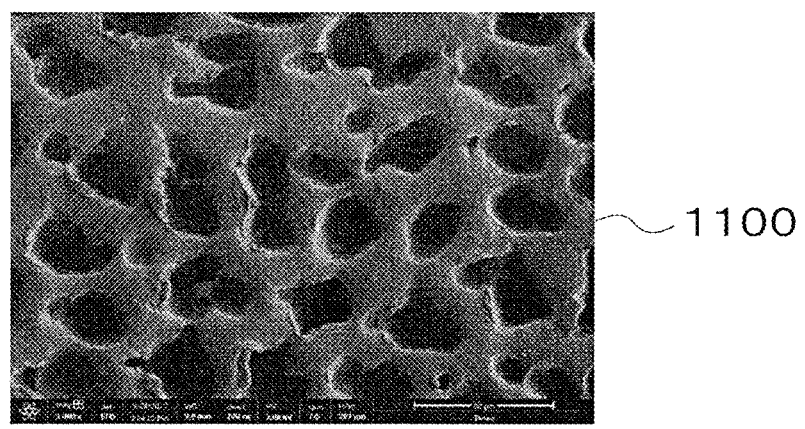
FIG. 11 is a picture of a resin component of one embodiment of the present invention, observed through an electron microscope.

The antireflection surfaces of resin components illustrated in FIGS. 21A to 21C and FIGS. 22A to 22C are featured in that the free surface 11, smoother than the first concave portions 12, and the first concave portions 12, surrounded by the free surface 11, are combined. As described above, the small second concave portions 31 are formed on the inner surfaces of the first concave portions 12, and thus the inner surfaces of the first concave portions 12 are rougher than the free surface 11. Here, in FIGS. 21A to 21C, the first concave portions 12 are arranged with regularity for easy understanding. However, as illustrated in FIG. 11, in the actual antireflection surface, the first concave portions 12 are formed randomly in shape, position, and size.

As previously described, the free surface 11 is formed such that a surface of the resin material that surrounds the first concave portions 12 does not contact the mold, used for molding the resin component, and that the surface of the resin material takes a free shape.

On the other hand, the second concave portions 31 formed on the inner surfaces of the first concave portions 12 have contacted the mold surface in the pressure keeping process. Thus, since the fine rough surface of the mold surface has been transferred to the resin material, the first concave portions 12 have rough surfaces.

The resin component illustrated in FIGS. 21A and 22A is formed by using a low constant pressure, and thus the total area of the free surface 11 is large and the total area of the first concave portions 12 having the second concave portions 31 is small. The shape as illustrated in FIGS. 21A and 22A can be obtained when injection molding is performed under a condition on constant pressure that causes the molten resin of the mold to be in a state as illustrated in FIG. 20A.

The shape as illustrated in FIGS. 21B and 22B can be obtained when injection molding is performed under a condition on constant pressure that causes the molten resin of the mold to be in a state as illustrated in FIG. 20B. In the resin component illustrated in FIGS. 21B and 22B, the ratio of the area of the free surface 11 to the area of the whole of the antireflection surface is almost equal to the ratio of the area of the first concave portions 12 having the second concave portions 31 to the area of the whole of the antireflection surface.

In the resin component illustrated in FIGS. 21C and 22C, the total area of the free surface 11 is small and the total area of the first concave portions 12 having the second concave portions 31 is large. The shape as illustrated in FIGS. 21C and 22C can be obtained when injection molding is performed under a condition on constant pressure that causes the molten resin of the mold to be in a state as illustrated in FIG. 20C.

As indicated in a later-described evaluation result (for example, FIG. 17), it has been found that when the antireflection surface has a structure as illustrated in FIGS. 21A and 22A, 21B and 22B, or 21C and 22C, the antireflection surface has good antireflection performance and durability. That is, the structure having good antireflection performance and durability is formed such that the first concave portions 12 having the second concave portions 31 are surrounded by the free surface 11. The formation of the structure having the free surface 11 can be controlled in accordance with the condition on (constant) pressure used when the shape of the mold surface is transferred.

On the other hand, if the resin component is molded in the state of FIG. 20D under the condition on constant pressure that allows the shape of all of the mold surface to be transferred to the molten resin, the free surface 11 is hardly formed on the resin component (the resin component corresponds to a later-described sample 5, for example). In this case, as described later, although the resin component has good antireflection performance, the resin component has lowered durability of the antireflection surface because the free surface 11, which is higher in position than the first concave portions 12 and protects the first concave portions 12, is hardly formed. In addition, the releasability of the resin component from the mold is lowered in the mold separation process (FIG. 9E), and thus one portion of the resin component may crack. Such a problem may reduce yield, and impair the stable injection molding. As described above, the transfer state as illustrated in FIG. 20D is not preferable. That is, since the surface roughened by the short-pulse laser has a steep convex-and-concave structure, if the resin material enters and reaches the bottom of the steep convex-and-concave structure in the transfer state as illustrated in FIG. 20D, strong force will be required to separate the resin component from the mold. As a result, a crack may occur in the resin material at a position where the stress exceeds a yield point.

In contrast, in the states as illustrated in FIGS. 20A to 20C of the present example, since the resin material does not reach the bottom of the steep convex-and-concave structure, the resin component can be separated from the mold with weak force. Thus, in the present example, in addition to that the free surface 11 can be formed so as to protect the first concave portions 12 as described above, when the resin component is separated from the mold, the stress hardly exceeds the yield point, and the resin components hardly causes crack.

The light-shielding performance or the antireflection performance of the molded resin component can be evaluated through a later-described measurement of mirror reflectivity. In this evaluation, it has been found that as the flatness of the free surface 11 decreases, the reflected light tends to decrease, improving light-shielding performance.

Figure 10:
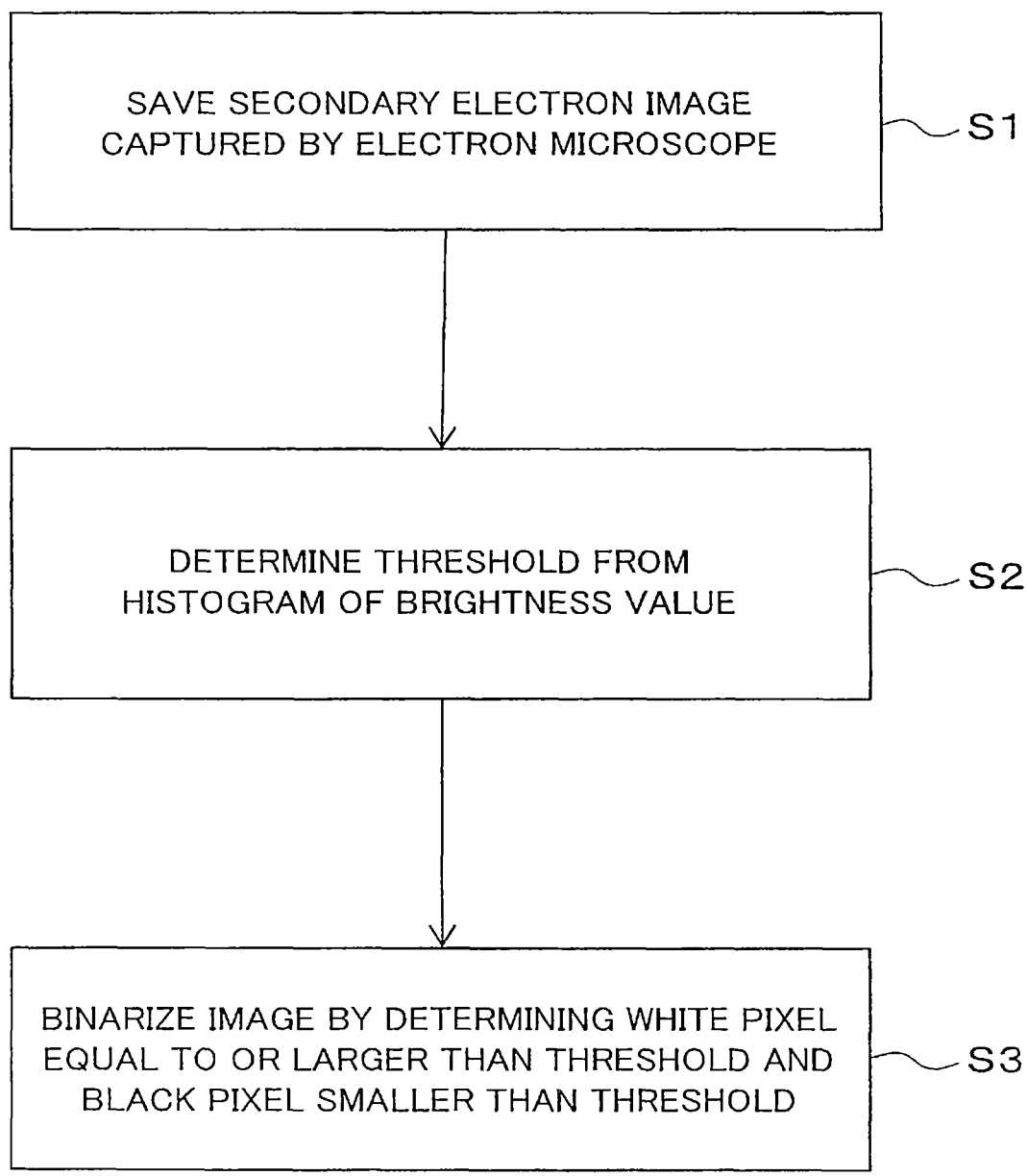
FIG. 10 is a flowchart illustrating procedures to evaluate an antireflection surface of a resin component of one embodiment of the present invention.

Here, a method of calculating and evaluating the ratio (area ratio) of the area of the first concave portions to the area of the whole of the antireflection surface of the resin component, made in the above-described manner, will be described. FIG. 10 is a flowchart illustrating procedures to calculate the ratio of the area of the first concave portions to the area of the whole of the antireflection surface. Here, the area of the first concave portions and the area of the whole of the antireflection surface are areas in a plan view. In the first example, data is analyzed by using an electron-microscope image. By using an electron microscope, the distribution of the free surface 41 (11) of the resin component of FIG. 4 and of the first concave portions 42 (12), and the ratio of the area of the free surface 41 (11) to the area of the first concave portions 42 (12) can be determined through the difference in brightness value.

In Step S1 of FIG. 10, a secondary electron image observed by using the electron microscope is stored. In Step S2, the image stored in Step S1 is quantized with brightness values of 256 gray scales (8 bits), to form a histogram. Since the free surface has high brightness values and the first concave portions have low brightness values, the distribution in the histogram is divided into two opposites. Then, a brightness value that is between the two opposites and gives a minimum point is determined as a threshold used to divide the distribution into the distribution on the free surface and the distribution on the first concave portions.

In Step S3 of FIG. 10, the image is binarized such that a pixel whose brightness value is equal to or larger than the threshold is determined as white and a pixel whose brightness value is smaller than the threshold is determined as black. Then, the ratio of the number of binarized white pixels to the number of binarized black pixels is determined as the ratio of the area of the free surface to the area of the first concave portions. Although the binarization is performed in the present example by using an observation image captured by the electron microscope, the binarization may be performed by using another method. For example, the histogram may be formed by using height data obtained through laser microscope measurement.

FIG. 11 illustrates the secondary electron image 1100 captured by the electron microscope in Step S1 of FIG. 10. In FIG. 11, a portion having a high brightness value corresponds to the free surface 41, and portions having a low brightness value correspond to the first concave portions 12. In particular, like the inner portions of the first concave portions 12, portions whose surfaces are roughened have a low brightness value (that is, the portions are dark).

Figure 12:
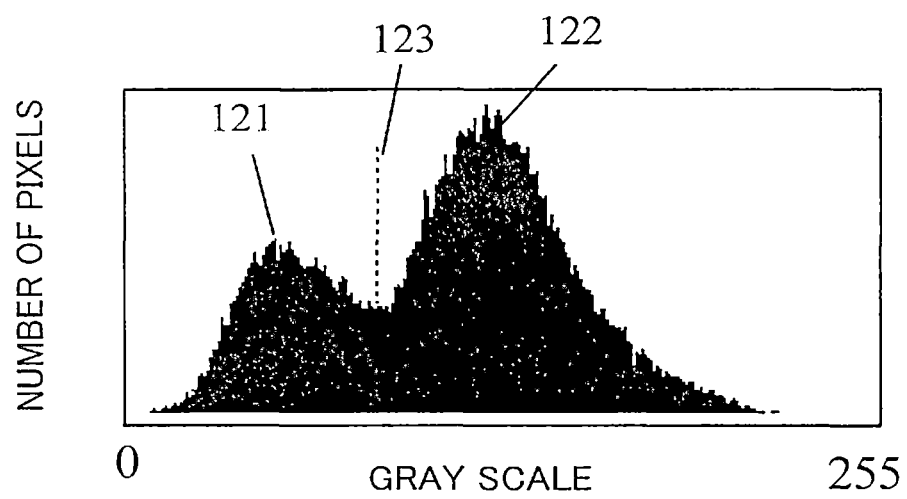
FIG. 12 is a histogram illustrating one example of brightness distribution of a resin component of one embodiment of the present invention.

FIG. 12 is a histogram in which the brightness values of the image obtained in Step S2 of FIG. 10 are shown in 256-level gray scale. In FIG. 12, the horizontal axis represents the 256-level gray scale, and the vertical axis represents the number of pixels. A reference numeral 121 indicates one peak in the gray scale, which corresponds to the first concave portions 12. A reference numeral 122 indicates another peak in the gray scale, which corresponds to the free surface 41. In addition, a reference numeral 123 indicates the minimum point located between the peak corresponding to the free surface 41 and the peak corresponding to the first concave portions 12. The gray-scale point corresponding to the minimum point can be set as the threshold used for the binarization.

Figure 13A:
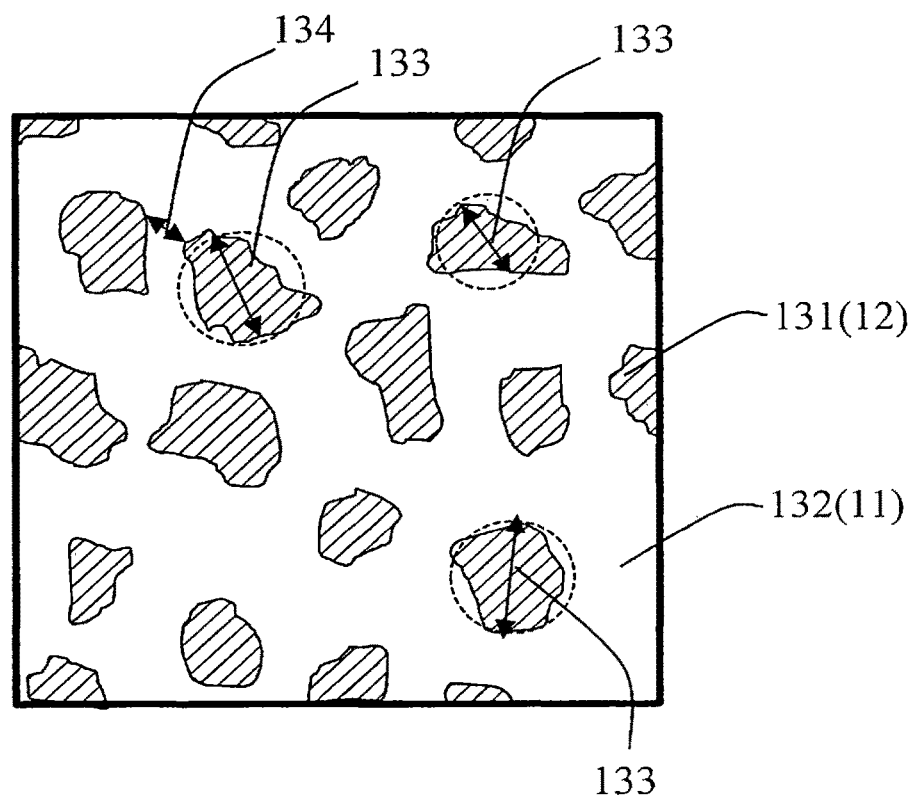
FIG. 13A is a plan view of a resin component of an example of the present invention.
Figure 13B:
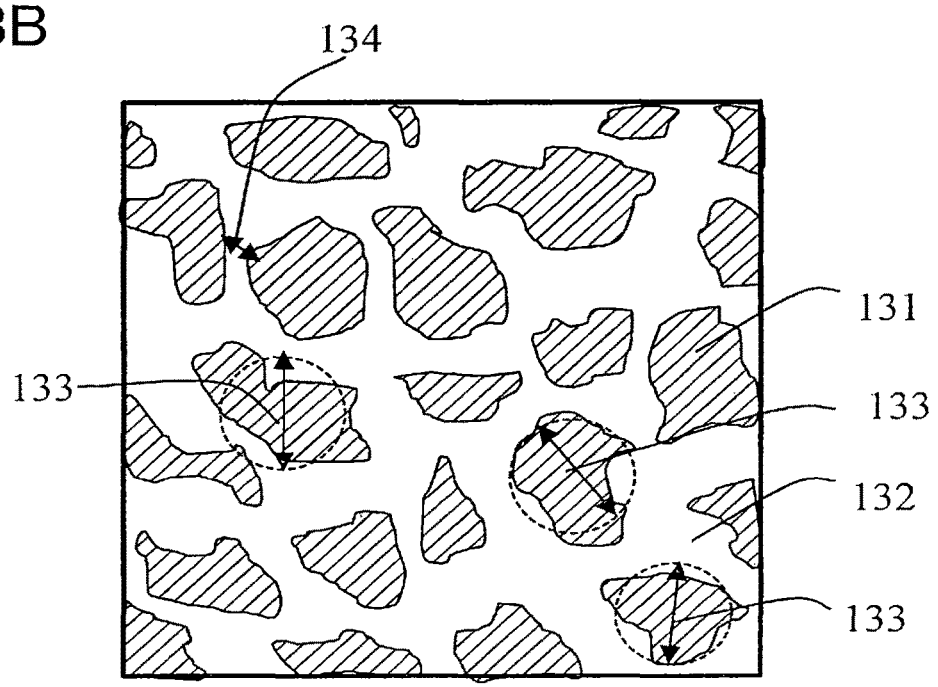
FIG. 13B is a plan view of a resin component of another example of the present invention.

FIGS. 13A and 13B illustrate results obtained by binarizing the histogram. FIG. 13A illustrates a result obtained by binarizing a histogram of a resin component that was molded by using a constant pressure of 60 MPa in the pressure keeping process of FIG. 9D. FIG. 13B illustrates a result obtained by binarizing a histogram of a resin component that was molded by using a constant pressure of 90 MPa in the pressure keeping process of FIG. 9D. In FIG. 13A, the ratio of the area of the first concave portions to the whole of the antireflection surface is 34%; in FIG. 13B, the ratio of the area of the first concave portions to the whole of the antireflection surface is 64%.

In FIGS. 13A and 13B, first concave portions 131 correspond to the first concave portions 12, and a free surface 132 corresponds to the free surface 11. In addition, a reference numeral 133 indicates an opening width of the first concave portions 131, and a reference numeral 134 indicates the shortest distance of distances, each of which is measured between two adjacent ones of the first concave portions 131. The opening width 133 of the first concave portions 131 of FIG. 13A is equal to or larger than 20 μm and equal to or smaller than 30 μm. The opening width 133 of the first concave portions 131 of FIG. 13B is equal to or larger than 20 μm and equal to or smaller than 30 μm. The aspect ratio of the first concave portions of FIG. 13A is in a range from 0.45 to 1.51, and the aspect ratio of the first concave portions of FIG. 13B is in a range from 0.55 to 1.67. The shortest distance of distances, each of which is measured between two adjacent ones of the first concave portions 131 of FIG. 13A, is 10 μm, and the shortest distance of distances, each of which is measured between two adjacent ones of the first concave portions 131 of FIG. 13B, is 8 μm. Thus, when the higher constant pressure of 90 MPa is applied to the molten resin, the area of the first concave portions 131 increases, and the area of the free surface 132 decreases. This is because the molten resin 912 enters the bottom portions of the concave portions of the mold surface 82 when a large pressure is applied to the molten resin 912.

Figure 14:
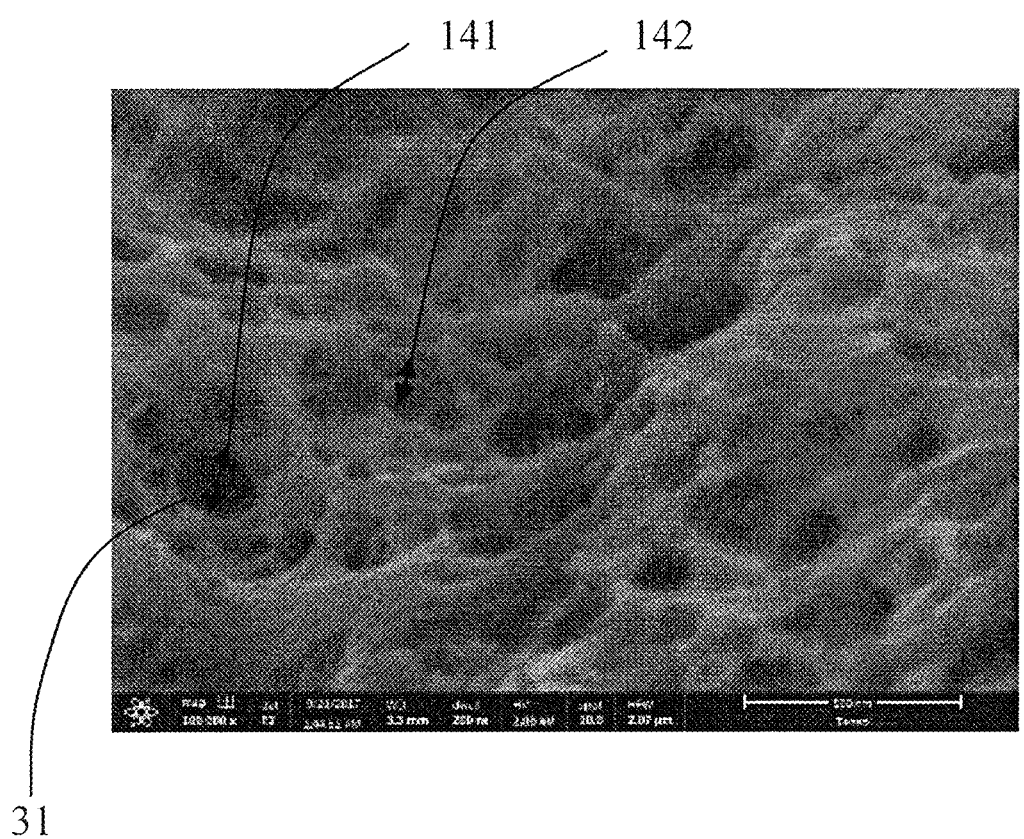
FIG. 14 is a picture of a resin component of one example of the present invention, observed through an electron microscope.

FIG. 14 is an image of the second concave portions 31 formed on the inner surfaces of the first concave portions 131, observed through an electron microscope. In FIG. 14, a reference numeral 141 indicates a maximum width of the second concave portions 31, and a reference numeral 142 indicates a minimum width of the second concave portions 31. In the present example, the maximum width 141 of the second concave portions 31 is 200 nm, and the minimum width 142 of the second concave portions 31 is 50 nm.

Figure 15:
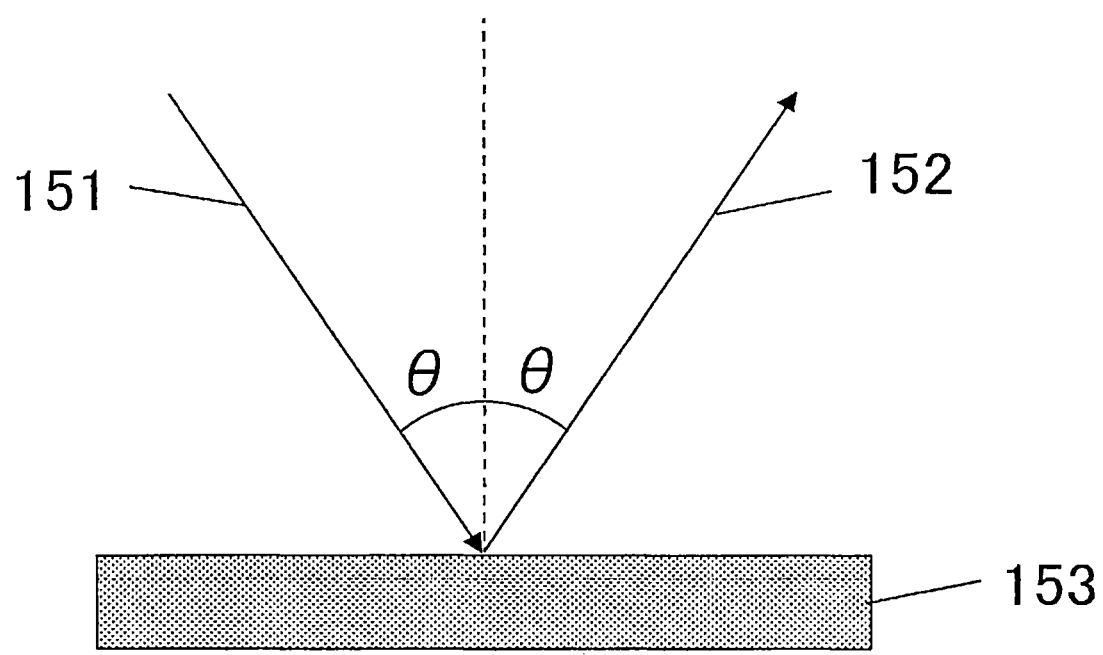
FIG. 15 is a diagram illustrating a method to measure mirror reflectivity.

In addition, for evaluating performances of resin components molded under the two constant pressures of 60 MPa and 90 MPa, the mirror reflectivity of the resin components was measured by using a reflectometer made by JASCO Corporation. As illustrated in FIG. 15, the mirror reflectivity is obtained by measuring an intensity of incident light 151 having a certain incidence angle θ, then measuring an intensity of reflected light 152 reflected off from a surface of a sample 153 and having a reflection angle θ equal to the incidence angle θ, and then determining the ratio of the intensity of the reflected light to the intensity of the incident light.

The mirror reflectivity has a large value if the surface of the sample 153 is like a mirror surface. In contrast, the mirror reflectivity has a small value if the surface of the sample 153 is roughed. Thus, when a resin component of the present invention is used as a later-described light-shielding member for a component, such as a mirror holder, which requires light-shielding performance or antireflection performance, the performance of the resin component is better if the mirror reflectivity of the resin component has a lower value.

Figure 16:
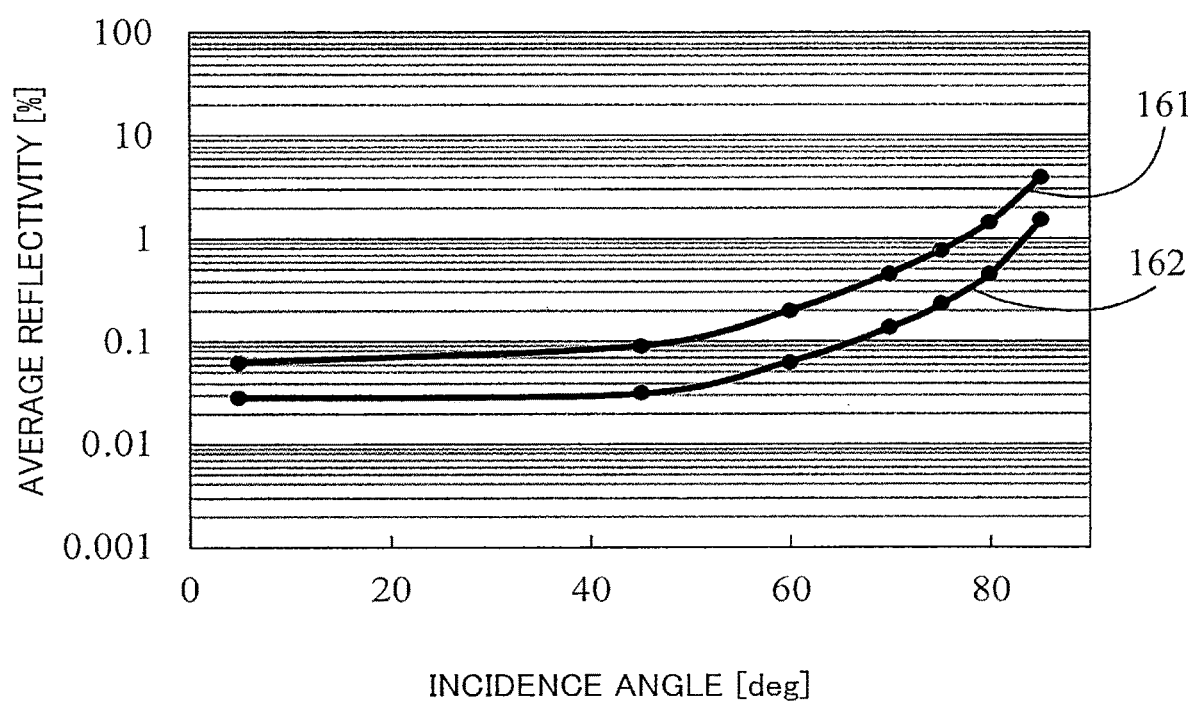
FIG. 16 is a graph illustrating average reflectivity of an antireflection surface of a resin component of an example of the present invention.

The mirror reflectivity of the resin components molded under the two constant pressures of 60 MPa and 90 MPa was measured with incidence angles from 5° to 85°. In addition, since the reflectivity depends on wavelength of incident light, measurement values for the light having wavelengths from 500 to 600 nm were averaged, and the averaged value was determined as an average reflectivity. FIG. 16 illustrates the measurement result on the mirror reflectivity.

In FIG. 16, a curve 161 indicates measurement values on the mirror reflectivity of the antireflection surface of a resin component injection-molded under the constant pressure of 60 MPa. The antireflection surface has a large ratio of the area of the free surface 41 to the area of the whole of the antireflection surface, and a small ratio of the area of the first concave portions 12 to the area of the whole of the antireflection surface. In general, as the incidence angle increases, the average reflectivity tends to increase. In conventional light-shielding members, the average reflectivity is nearly 10% at an incidence angle of 85°. However, the curve 161 of FIG. 16 indicates that the reflectivity is less than 5% at an incidence angle of 85°. Thus, it is found that the resin component has good antireflection performance.

In FIG. 16, a curve 162 indicates measurement values on the mirror reflectivity of the antireflection surface of a resin component injection-molded under the constant pressure of 90 MPa. The antireflection surface has a small ratio of the area of the free surface 41 to the area of the whole of the antireflection surface, and a large ratio of the area of the first concave portions 12 to the area of the whole of the antireflection surface. The measurement results on the mirror reflectivity indicated by the curve 162 are better than those indicated by the curve 161. That is, the average reflectivity of the resin component injection-molded under the constant pressure of 90 MPa is lower than the average reflectivity of the resin component injection-molded under the constant pressure of 60 MPa in all incidence angles from 5° to 85°. Thus, it is found that the resin component injection-molded under the constant pressure of 90 MPa has better antireflection performance than that of the resin component injection-molded under the constant pressure of 60 MPa.

Figure 26:
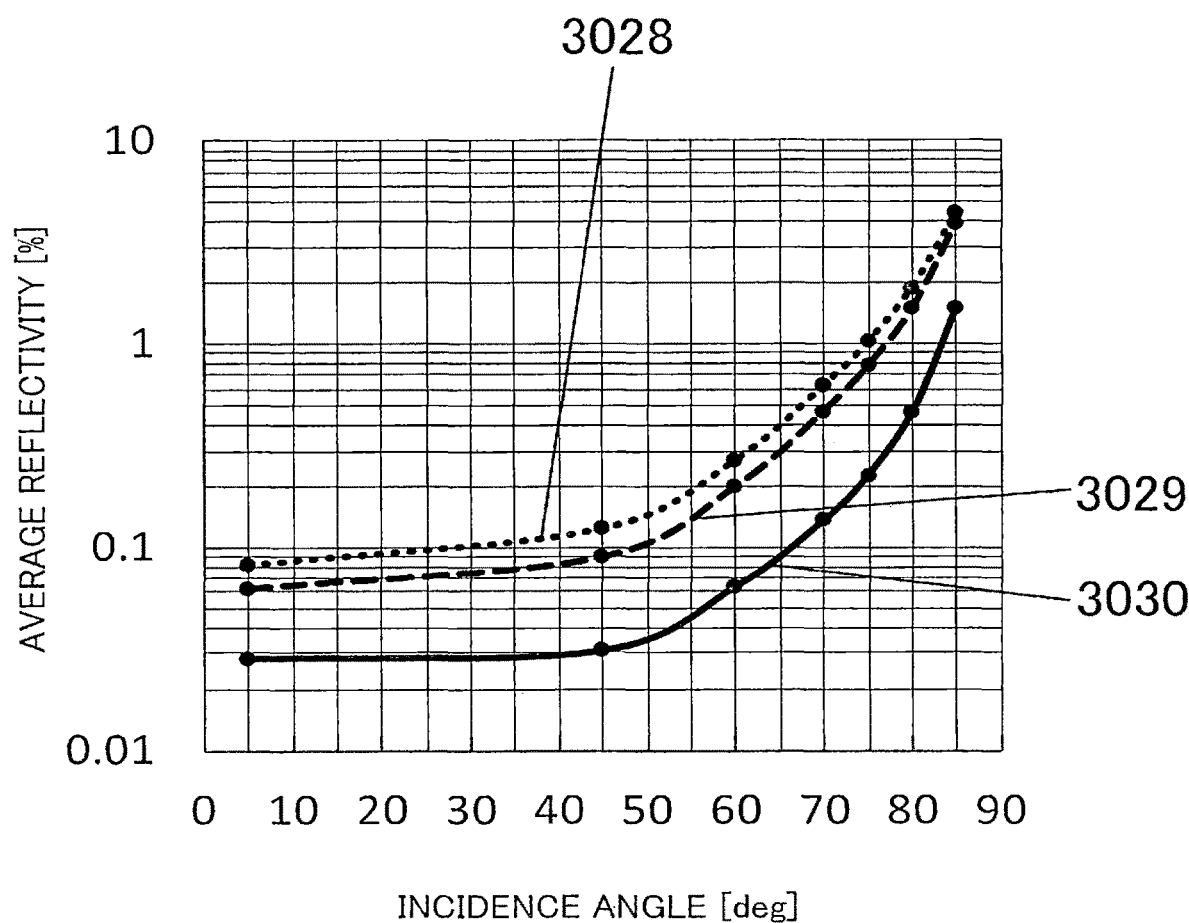
FIG. 26 is a graph illustrating average reflectivity of an antireflection surface of a resin component of another example of the present invention.

FIG. 26 illustrates the measurement result on the mirror reflectivity of a resin component injection-molded under a lower constant pressure of 40 MPa in the same manner as that of FIG. 16, in addition to the measurement results on the mirror reflectivity of the resin components injection-molded under the constant pressures of 60 MPa and 90 MPa.

In FIG. 26, a curve 3029 equals the curve 161 of FIG. 16, and indicates the measurement values on the mirror reflectivity of the antireflection surface of the resin component injection-molded under the constant pressure of 60 MPa. In addition, a curve 3030 of FIG. 26 equals the curve 162 of FIG. 16, and indicates the measurement values on the mirror reflectivity of the antireflection surface of the resin component injection-molded under the constant pressure of 90 MPa.

In FIG. 26, a curve 3028 indicates measurement values on the mirror reflectivity of the antireflection surface of a resin component injection-molded under the constant pressure of 40 MPa. The antireflection surface has a large ratio of the area of the free surface 41 to the area of the whole of the antireflection surface, and a small ratio of the area of the first concave portions 12 to the area of the whole of the antireflection surface. As can be seen, even when the constant pressure of 40 MPa lower than 60 MPa is applied to the resin material, the curve 3028 indicates that the mirror reflectivity is less than 5% at an incidence angle of 85°. Thus, it is found that the resin component injection-molded under the constant pressure of 40 MPa still has good antireflection performance.

FIG. 17 is a table that illustrates antireflection performance and durability of samples 1, 2, 3, 4, 5, and 6. The samples are various resin components molded in various conditions, including the condition on constant pressure in the injection molding and the condition on injection molding such as the molten resin temperature.

The sample 1 of FIG. 17 was molded, with the condition on injection molding adjusted so that the ratio of the area of the first concave portions to the area of the whole of the antireflection surface was 34% and the shortest distance of the first concave portions was 10 μm. The sample 2 was molded, with the condition on injection molding adjusted so that the ratio of the area of the first concave portions to the area of the whole of the antireflection surface was 64% and the shortest distance of the first concave portions was 8 μm. The sample 3 was molded, with the condition on injection molding adjusted so that the ratio of the area of the first concave portions to the area of the whole of the antireflection surface was 10% and the shortest distance of the first concave portions was 100 μm. The sample 4 was molded, with the condition on injection molding adjusted so that the ratio of the area of the first concave portions to the area of the whole of the antireflection surface was 95% and the shortest distance of the first concave portions was 5 μm.

In the samples 1 to 4, the free surface 41 is distributed such that the first concave portions 12 are surrounded by the free surface 41 of the antireflection surface. Here, the ratio of the area of the free surface 41 to the area of the whole of the antireflection surface may be a value obtained by subtracting from 100%, the ratio of the area of the first concave portions to the area of the whole of the antireflection surface.

The sample 5 was molded, with the condition on injection molding adjusted so that the ratio of the area of the first concave portions to the area of the whole of the antireflection surface was 96% and the shortest distance of the first concave portions was 2 μm. The sample 6 was molded, with the condition on injection molding adjusted so that the ratio of the area of the first concave portions to the area of the whole of the antireflection surface was 9% and the shortest distance of the first concave portions was 110 μm. In the sample 5, the free surface 41 is hardly formed on the antireflection surface. In the sample 6, most of the antireflection surface is the free surface 41, and the first concave portions 12 having small sizes are scattered in the antireflection surface. The sample 5 is similar to a conventional structure in which only a simple fine rough surface is formed without the free surface 41. The sample 6 has a structure in which most of the antireflection surface is the free surface 41 and the first concave portions 12 having the second concave portions 31 to reduce the reflection of the stray light are hardly formed.

The antireflection performance of the samples was evaluated by measuring the mirror reflectivity of the antireflection surface of each sample. In FIG. 17, the results on the antireflection performance are indicated by alphabet A (excellent), B (good), and C (acceptable). Also, the results on the durability of the samples are indicated by the alphabet A (excellent), B (good), and C (acceptable). The durability was tested as follows: a piece of silbon paper was impregnated with ethanol, then the antireflection surface of each sample was wiped 50 times with a force of 250 gw to produce friction on the antireflection surface, and then the mirror reflectivity was measured again to evaluate whether the antireflection performance had changed.

In the sample 5 on which only the fine rough surface is formed without the free surface 41, good antireflection performance was obtained because most of the antireflection surface is the first concave portions 12. However, the antireflection performance of the sample 5 may deteriorate after the wiping, because the second concave portions 31 may be damaged or worn. In the sample 6 in which most of the antireflection surface is the free surface 41, sufficient antireflection performance was not obtained. However, the antireflection performance was hardly changed after the wiping, because the first concave portions 12, which are lower in position than the free surface 41 and have the second concave portions 31, were well protected by the free surface 41.

In the samples 1 to 4, since the free surface 41 is distributed such that the first concave portions 12 are surrounded by the free surface 41 of the antireflection surface, the antireflection performance of these samples was excellent or good. In addition, the antireflection performance of these samples was hardly changed after the antireflection surface was wiped, thus exhibiting sufficient durability. Among these samples, the sample 4 exhibited excellent (A) antireflection performance, and the sample 3 exhibited excellent (A) durability.

FIG. 30 is a table that illustrates antireflection performance and durability of samples 7, 8, 9, 10, 11, and 12. The samples are various resin components molded with various values of mass percentage of filler. In FIG. 30, results on evaluation are indicated by the alphabet A (excellent), B (good), and C (acceptable) in the same manner as that of FIG. 17. In addition, the condition on constant pressure in the injection molding and the condition on injection molding such as the molten resin temperature are the same as those described with reference to FIG. 17.

The sample 7 of FIG. 30 was molded, with the resin material prepared so that the rate of content of the filler to the whole of the resin material was 5 mass percent and the Spc value on the surface roughness of the free surface was 1500. The sample 8 was molded, with the resin material prepared so that the rate of content of the filler to the whole of the resin material was 15 mass percent and the Spc value on the surface roughness of the free surface was 3000. The sample 9 was molded, with the resin material prepared so that the rate of content of the filler to the whole of the resin material was 30 mass percent and the Spc value on the surface roughness of the free surface was 6500. The sample 10 was molded, with the resin material prepared so that the rate of content of the filler to the whole of the resin material was 45 mass percent and the Spc value on the surface roughness of the free surface was 9000.

The sample 11 was molded, with the resin material prepared so that the rate of content of the filler to the whole of the resin material was 4 mass percent and the Spc value on the surface roughness of the free surface was 1450. The sample 12 was molded, with the resin material prepared so that the rate of content of the filler to the whole of the resin material was 46 mass percent and the Spc value on the surface roughness of the free surface was 9100. The sample 11 has the free surface 41 that is hardly roughed. The sample 12 has the free surface 41 whose Spc value is 9100 or more. In the sample 12, since the surface roughness of the free surface is large, the durability may deteriorate although the reflection of the stray light can be sufficiently suppressed. In addition, when the rate of content of the filler to the whole of the resin material exceeds 46 mass percent, the resin material of the mold will insufficiently flow in the injection molding, possibly deteriorating the quality of external appearance.

As described above, the antireflection surface of the resin component of the present example has the structure in which the fine rough surface 23, formed by the second concave portions 31, is formed on each of the first concave portions 12. With this structure, excellent shielding effect for the stray light and antireflection performance can be achieved. In addition, in the antireflection surface of the resin component of the present example, since the free surface 41 is distributed such that the first concave portions 12 are surrounded by the free surface 41, the fine rough surface 23 formed on the inner surfaces of the first concave portions 12 can be effectively protected against wiping. That is, the present example can provide a resin component having an antireflection surface that can be simply made at low cost, has good durability, produces less dust, and has good antireflection performance.

Second Example

In the first example, injection molding is performed to transfer the shape of a mold surface to an antireflection surface of a resin component. However, not the injection molding but molding using a roll mold, as described below, may be used to transfer the shape of a mold surface to an antireflection surface of a resin component.

Figure 23:
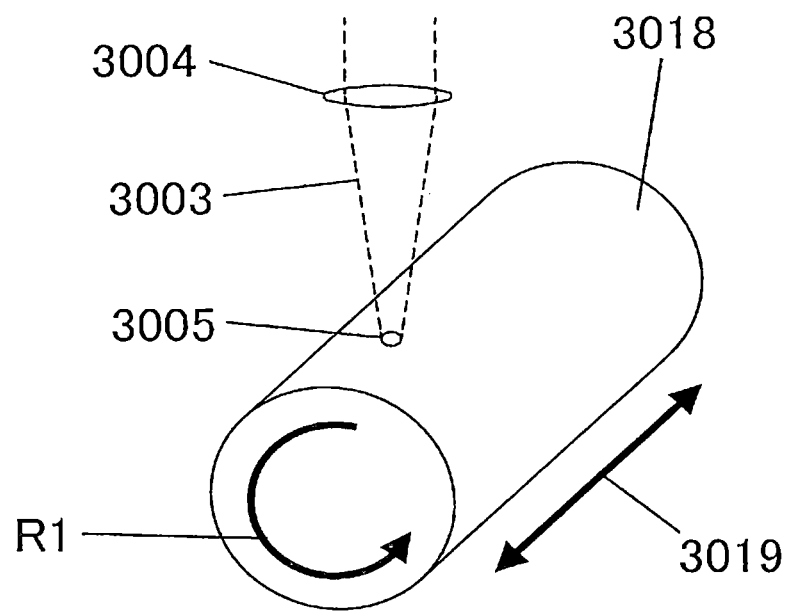
FIG. 23 is a diagram illustrating a process to roughen a surface of a roll mold of one embodiment of the present invention.

In FIG. 23, a laser beam 3003 used for machining is reduced in diameter of its cross section by a lens 3004, and an irradiation area 3005 of the surface of a cylindrical mold (roll mold) 3018 is irradiated with the laser beam 3003. By a driving mechanism (not illustrated), the mold 3018 is rotated toward a direction indicated by an arrow R1, and reciprocated in a direction 3019 so that the laser beam can scan the surface of the mold 3018. The scanning of the mold surface in the direction 3019 may be performed by a galvanometer mirror causing the laser beam 3003 to scan the mold surface. With this operation, the surface of the cylindrical mold 3018 can be roughed on the same principle for machining as that described above.

Conditions on irradiation by the pulse laser 3003 can be determined by the method described with reference to FIG. 8, and the fine rough surface and the larger convex-and-concave structure can be formed on the surface of the cylindrical mold through the processes illustrated in FIGS. 19A to 19D.

Figure 24:
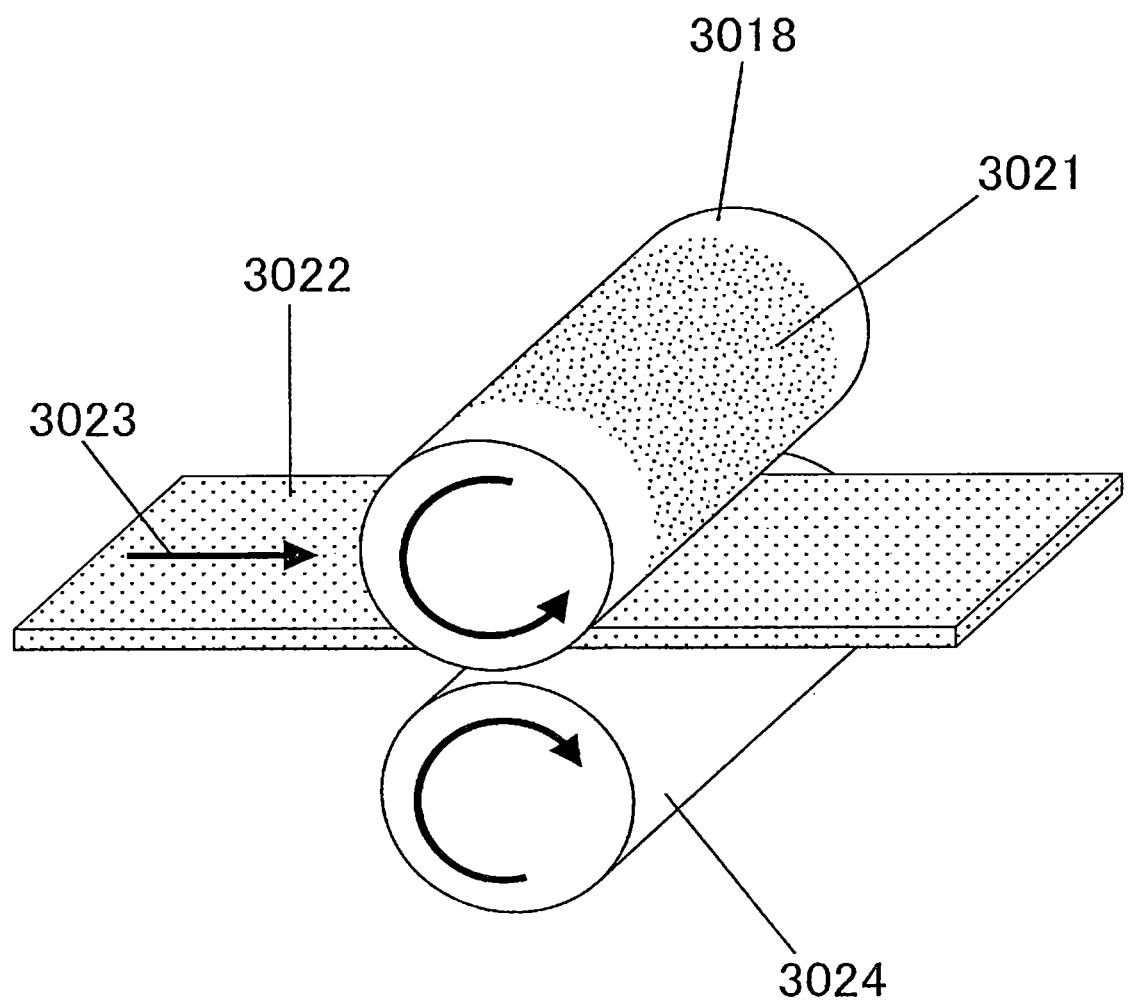
FIG. 24 is a diagram illustrating a process to roll-mold a resin component by using the mold made through the process of FIG. 23.

FIG. 24 illustrates the mold (roll mold) 3018 that is transferring the shape of the mold surface, formed in the above-described manner, to the antireflection surface of a resin material 3022. Although only one portion of the resin material 3022 is illustrated in FIG. 24, the resin material 3022 is a sheet that has typically been seamlessly and continuously rolled.

The resin material 3022 is conveyed toward a direction indicated by an arrow 3023, by a conveyance mechanism (not illustrated). In this time, the resin material 3022 passes through space between the cylindrical mold 3018 (the surface of which has been machined in the above-described manner) and a cylindrical facing roll mold 3024 that is rotated depending on the rotation of the mold 3018. The two cylindrical molds 3018 and 3024 are being urged toward a pressure-contact direction by an urging means (not illustrated), and a rotational direction in which the cylindrical mold 3018 rotates is opposite to a rotational direction in which the cylindrical mold 3024 rotates. The cylindrical molds 3018 and 3024 rotate in their rotational directions to pull the resin material 3022 into the space between the molds 3018 and 3024 and send the resin material 3022 toward a direction opposite to a direction from which the resin material 3022 has been conveyed. A mold surface 3021 of the cylindrical mold 3018 is roughed in the above-described manner. Here, the surface of the cylindrical mold 3024 is not roughened in FIG. 24. However, the surface of the cylindrical mold 3024 may also be roughened to transfer the shape of the surface of the mold 3024 to the back surface of the resin material 3022. For example, the shape of the surface of the mold 3024 may be different from the shape of the surface of the mold 3018.

In addition, the gap between the two cylindrical molds 3018 and 3024 is smaller than the thickness of the resin material 3022 obtained before the resin material 3022 passes through the space between the two cylindrical molds 3018 and 3024. By setting the gap between the molds 3018 and 3024, the pressure applied when the shape of the mold surface 3021 is transferred to the resin material 3022 can be set. Here, the pressure corresponds to the constant pressure applied in the above-described injection molding. The pressure to transfer the shape of the mold surface 3021 to the resin material 3022 increases as the gap between the molds 3018 and 3024 decreases.

Preferably, the gap between the two cylindrical molds 3018 and 3024 is adjusted by an adjusting mechanism (not illustrated). Thus, by adjusting the pressure to transfer the shape of the mold surface 3021 to the resin material 3022, the distribution of the free surface 41 and the first concave portions 12 can be fixed. In addition, the shape of the mold surface is easily transferred to the resin material 3022 in high temperature. For this reason, the resin material 3022 and the cylindrical molds 3018 and 3024 may be heated by a heating mechanism (not illustrated) in accordance with the composition of the resin material 3022, and the shape of the mold surface 3021 of the mold 3018 may be transferred to the resin material 3022 in high temperature.

Figure 25A:
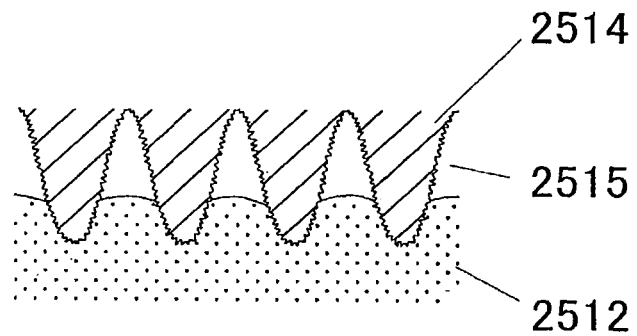
FIG. 25A is a cross-sectional view in a molding process to form a resin component having a large free surface.
Figure 25B:
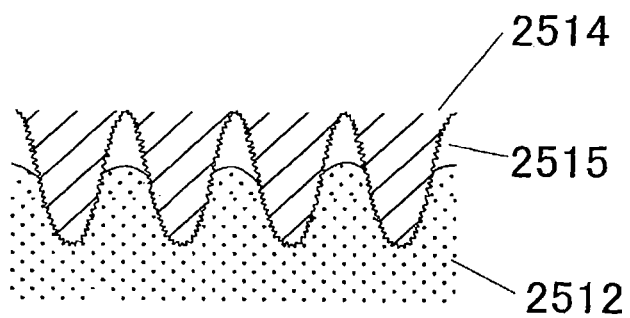
FIG. 25B is a cross-sectional view in a molding process to form a resin component having a medium-size free surface.
Figure 25C:
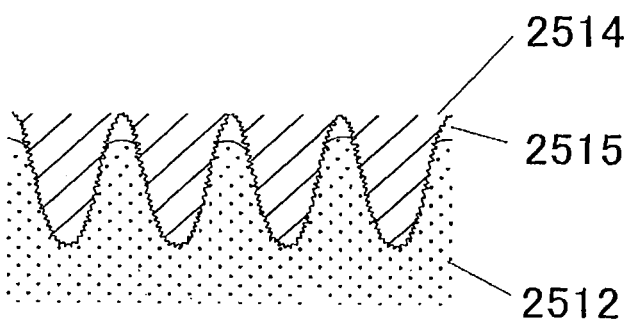
FIG. 25C is a cross-sectional view in a molding process to form a resin component having a small free surface.

FIGS. 25A to 25C schematically illustrate transfer states obtained when the pressure to transfer the shape of the mold surface 3021 is varied by adjusting the gap between the molds 3018 and 3024. FIGS. 25A to 25C correspond to FIGS. 20A to 20C illustrating the transfer states obtained in the above-described injection molding.

In FIG. 25A, a reference numeral 2514 indicates a cross section of the surface of the cylindrical mold, and the surface of the cylindrical mold is roughened by the short-pulse laser such that the convex-and-concave structure and the small concave and convex portions are combined. A resin material 2512 corresponds to the resin material 3022 of FIG. 24. In FIG. 25A, the resin material 2512 contacts convex portions of the mold 2514, but does not contact concave portions of the mold 2514. As a result, the space 2515 is formed between the resin material 2512 and the concave portions of the mold 2514.

In FIG. 25B, since the gap between the two cylindrical molds 3018 and 3024 of FIG. 24 is smaller than that of FIG. 25A, the pressure to transfer the shape of the mold surface 3021 is increased. Similar to FIG. 25A, the resin material 2512 contacts the convex portions of the mold 2514, but does not contact the concave portions of the mold 2514. As a result, the space 2515 is formed. However, the space 2515 is smaller than that of FIG. 25A because the pressure applied by the molds 3018 and 3024 (FIG. 24) is increased.

In FIG. 25C, since the gap between the molds 3018 and 3024 (FIG. 24) is smaller than that of FIG. 25B, the pressure to transfer the shape of the mold surface 3021 is further increased. In FIG. 25C, similar to FIGS. 25A and 25B, the resin material 2512 contacts the convex portions of the mold 2514, but does not contact the concave portions of the mold 2514. As a result, the space 2515 is formed. However, the space 2515 is smaller than those of FIGS. 25A and 25B because the pressure applied by the molds 3018 and 3024 (FIG. 24) is further increased.

As described above, when the shape of the mold surface is transferred to the antireflection surface by using the roll mold, the gap between the molds 3018 and 3024 (FIG. 24) may be controlled as in the method which controls the constant pressure in the injection molding. For example, by controlling the gap between the molds 3018 and 3024 (FIG. 24), the first concave portions 12 and the free surface 41, which surrounds the first concave portions 12, can be formed on the antireflection surface, with desired distribution and the area ratio, as in the injection molding.

Third Example

In a third example, a barrel of an optical device and a container of an optical system will be described. Examples of the container include a supporting member such as a mirror holder, and the barrel and the container are one example of products of the present invention.

Figure 27:
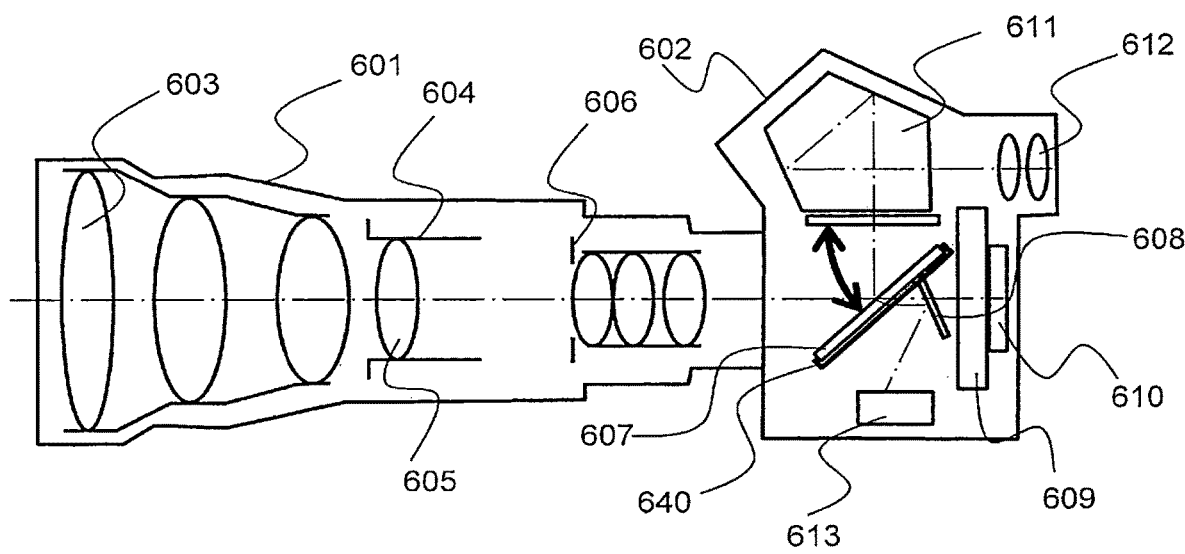
FIG. 27 is a diagram schematically illustrating an optical product including a resin component of the present invention.

FIG. 27 illustrates a configuration of a single-lens digital reflex camera, which is an optical device that includes, as a light-shielding member, a resin component having an antireflection surface of the present embodiment. In FIG. 27, an imaging lens 601 is attached to a camera body 602. Light from an object is captured via optical elements, such as lenses 603 and 605, disposed on an optical axis of the imaging optical system of the imaging lens 601. In particular, the lens 605 is supported by an inner barrel 604 so that the lens 605 can move with respect to an outer barrel of the imaging lens 601 for focusing or zooming.

When a user observes an object before capturing an image of the object, a part of the light from the object reflects from a main mirror 607, passes through a prism 611 and a finder lens 612, and reaches the user. The main mirror 607 is a half mirror, and the light having passed through the main mirror 607 is reflected from a submirror 608 toward an autofocus (AF) unit 613. The light reflected from the submirror 608 is used to measure a distance. When an image is captured, the main mirror 607 and the submirror 608 are moved out of the optical path by a driving mechanism (not illustrated), a shutter 609 is opened, and the light from the imaging lens 601 forms its image on an imaging element 610. A diaphragm 606 can change brightness and focal depth, used for capturing images, by changing the area of the aperture of the diaphragm 606.

When a film-based camera is used, the imaging element 610 of the single-lens reflex camera of FIG. 27 is replaced by an area in which a silver halide film is positioned and through which the silver halide film is moved. The imaging lens 601 may be fixed to the camera body 602, but in an optical device such as a camera, may be an interchangeable lens that can be detachably attached to the camera body 602.

The main mirror 607 is attached to a main-mirror holder 640 via adhesive material and supported by the main-mirror holder 640. When images are not captured, the main mirror 607 and the main-mirror holder 640 of FIG. 27 are positioned at a position at which the main mirror 607 reflects a part of the light toward the finder lens 612. When an image is captured, the main mirror 607 and the main-mirror holder 640 are swung to a horizontal position illustrated in FIG. 27, as indicated by an arrow, by a driving mechanism (not illustrated) simultaneously when the shutter 609 is opened. At this time, the submirror 608 is closed so as to be flush with the main-mirror holder 640, in synchronization with the swing of the main mirror 607.

The main-mirror holder 640 is swung for moving the main mirror 607 out of the optical path used for capturing images, and for blocking an optical path between the finder lens 612 and the main mirror 607 to prevent ghost caused by the light coming from the finder lens 612. When an image is captured, the imaging element 610 is exposed for a necessary time, and then the shutter 609 is closed. When the shutter 609 is closed, the main-mirror holder 640 causes the main mirror 607 to quickly return to the position of FIG. 27 for allowing the user to see the image through the finder lens 612. For this reason, the main mirror 607 moved by the main-mirror holder 640 is called an instant return mirror.

The resin component having the antireflection surface of the present invention can be used, in such an optical device of FIG. 27, for the barrel of the imaging lens 601, in particular, for the inner barrel 604 and the outer barrel of the imaging lens 601 that supports the inner barrel 604. Here, the imaging lens 601 may be fixed to the camera body, or may be an interchangeable lens. When the resin component is used for the inner barrel 604 that contains the lens 605 serving as an optical element, the antireflection surface of the resin component faces the optical axis of the optical system including the optical element.

The optical system for capturing images includes, in addition to the imaging lens 601, a light-shielded room of the camera body 602 through which the light passes for capturing images, as described above. The light-shielded room of the camera body 602 is a container required to be shielded from light, and thus the resin component having the antireflection surface of the present invention can be used also for the container. Specifically, the resin component of the present invention can be used for an inner wall of the light-shielded room of the camera body 602. In this case, the antireflection surface of the resin component faces the optical path of the optical system of the light-shielded room.

The container of the optical system of the optical device of FIG. 27 may include a supporting member such as the main-mirror holder 640. For example, edge portions of the front surface and the back surface of the main-mirror holder 640 are portions on which the main mirror 607 and the submirror 608 are not disposed. These portions are required to have an antireflection surface and reflect light as less as possible. Thus, the resin component of the present invention can be used also for the container of the optical system, in particular, for the supporting member such as the mainmirror holder 640. Specifically, the antireflection surface of the resin component may be formed on the portions of the supporting member on which the main mirror 607 and the submirror 608 are not disposed. For example, the antireflection surface may be formed on the edge portions of the front surface and the back surface of the supporting member.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-142974, filed Jul. 30, 2018, and Japanese Patent Application No. 2019-115710, filed Jun. 21, 2019, which are hereby incorporated by reference herein in their entirety.

What is claimed is:

1. A resin product comprising an antireflection surface comprising:
   a plurality of first concave portions having opening widths of 1 μm to 300 μm;
   a plurality of second concave portions formed on each of the plurality of first concave portions and having opening widths of 10 nm to 1 μm, and
   a component surface configured to surround each of the plurality of first concave portions,
   wherein the component surface includes a saddle-shaped convex portion on which no concave portions having opening widths of 10 nm to 1 μm are formed.

2. The resin product according to claim 1, wherein a ratio of an area of the first concave portions to an area of the antireflection surface is 10% to 95%.

3. The resin product according to claim 1, wherein a shortest distance of distances, each of which is measured between two adjacent ones of the plurality of first concave portions, is equal to or smaller than 100 μm.

4. The resin product according to claim 1, wherein a ratio of any one of the opening widths of the plurality of first concave portions to a corresponding one of depths of the first concave portions is equal to or larger than 0.4.

5. The resin product according to claim 1, wherein the component surface comprises a free surface, and
   wherein the free surface is formed such that the free surface does not contact a mold used to mold the resin product.

6. The resin product according to claim 5, wherein the component surface has a curved convex surface.

7. The resin product according to claim 1, wherein the antireflection surface is made of a resin material, and
   wherein the resin material contains a filler.

8. The resin product according to claim 7, wherein a rate of content of the filler to the resin material is 5 mass percent to 45 mass percent.

9. The resin product according to claim 7, wherein a diameter of each particle of the filler is 20 μm to 80 μm, and a length of each particle of the filler is 70 μm to 100 μm.

10. The resin product according to claim 1, wherein a surface roughness of the component surface is indicated by an Spc value, and
    wherein the Spc value of the component surface is 1500 to 9000.

11. An interchangeable lens comprising:
    a supporting member comprising the resin product according to claim 1, and
    an optical element supported on an optical axis by the supporting member.

12. An optical device comprising:
    a container comprising the resin product according to claim 1, and
    an optical system contained by the container.

13. The resin product according to claim 1, wherein a contour of the plurality of first concave portions has a shape formed by a first concave curve, a second concave curve, a first convex curve, and a second convex curve,
    wherein a curvature of the first concave curve is different from a curvature of the second concave curve, and a curvature of the first convex curve is different from a curvature of the second convex curve.

14. A method of making a resin product comprising an antireflection surface, the method comprising:
    preparing a mold having a molding surface, which comprises a plurality of first convex portions and a plurality of second convex portions formed on surfaces of the plurality of first convex portions, the plurality of first convex portions having diameters equal to or larger than 1 μm, the plurality of second convex portions having diameters of 10 nm to 1 μm; and
    forming a plurality of first concave portions on a resin material and forming a plurality of second concave portions on inner surfaces of the plurality of first concave portions by causing the resin material to contact the mold, the plurality of first concave portions of the resin material having opening widths of 1 μm to 300 μm, and the plurality of second concave portions of the resin material having opening widths of 10 nm to 1 μm,
    wherein a component surface surrounds each of the plurality of first concave portions of the resin material, the component surface including a saddle-shaped convex portion on which no concave portions having opening widths of 10 nm to 1 μm are formed.

15. The method according to claim 14, wherein the forming of the plurality of first and second concave portions comprises controlling transfer pressure so that a ratio of an area of the plurality of first concave portions to an area of the antireflection surface is 10% to 95%.

16. The method according to claim 14, wherein the forming of the plurality of first and second concave portions comprises controlling transfer pressure so that a shortest distance of distances, each of which is measured between two adjacent ones of the plurality of first concave portions, is equal to or smaller than 100 μm.

17. The method according to claim 14, wherein the forming of the plurality of first and second concave portions comprises controlling transfer pressure so that a ratio of any one of the opening widths of the plurality of first concave portions to a corresponding one of depths of the first concave portions is equal to or larger than 0.4.

18. The method according to claim 14, wherein the forming of the plurality of first and second concave portions comprises using the resin material that contains a filler.

19. The method according to claim 14, wherein the preparing the mold comprises attaching the mold to an injection molding apparatus.

20. The method according to claim 14, wherein the preparing the mold comprises attaching the mold to a roll-mold molding apparatus.

* * * * *